(12) United States Patent
Oh et al.

(10) Patent No.: US 11,984,297 B2
(45) Date of Patent: May 14, 2024

(54) PLASMA CONTROL DEVICE AND PLASMA PROCESSING SYSTEM

(71) Applicant: SAMSUNG ELECTRONICS CO., LTD., Suwon-si (KR)

(72) Inventors: Sejin Oh, Hwaseong-si (KR); Youngdo Kim, Hwaseong-si (KR); Sanghun Kim, Hwaseong-si (KR); Sungyeol Kim, Yongin-si (KR); Younghwan Kim, Seoul (KR); Taemin Earmme, Hwaseong-si (KR); Changyun Lee, Hwaseong-si (KR); Sunghun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 181 days.

(21) Appl. No.: 17/711,181

(22) Filed: Apr. 1, 2022

(65) Prior Publication Data
US 2023/0091161 A1 Mar. 23, 2023

(30) Foreign Application Priority Data
Sep. 23, 2021 (KR) .................. 10-2021-0125525

(51) Int. Cl.
*H01J 37/32* (2006.01)
*H01L 21/311* (2006.01)

(52) U.S. Cl.
CPC .. *H01J 37/32183* (2013.01); *H01J 37/32165* (2013.01); *H01J 37/32568* (2013.01); *H01L 21/31116* (2013.01); *H01J 2237/334* (2013.01)

(58) Field of Classification Search
CPC .......... H01J 37/32183; H01J 37/32165; H01J 37/32568; H01J 2237/334; H01L 21/31116
See application file for complete search history.

(56) References Cited

U.S. PATENT DOCUMENTS

| | | | |
|---|---|---|---|
| 6,537,421 B2 | 3/2003 | Drewery |
| 7,169,256 B2 | 1/2007 | Dhindsa et al. |
| 7,527,016 B2 | 5/2009 | Yamazawa et al. |
| 8,297,224 B2 | 10/2012 | Ishimaru |
| 9,337,001 B2 | 5/2016 | Ashida |

(Continued)

FOREIGN PATENT DOCUMENTS

KR 10-2021-0009344 A 1/2021

*Primary Examiner* — Henry Luong
(74) *Attorney, Agent, or Firm* — Muir Patent Law, PLLC

(57) ABSTRACT

A plasma control device includes a matching circuit, a resonance circuit, and a controller. The matching circuit is connected to a first electrode of a plasma chamber including the first electrode and a second electrode, and matches impedance of a radio frequency (RF) power by an RF driving signal with an impedance of the first electrode. The RF driving signal is based on a first RF signal having a first frequency. The resonance circuit is connected between the second electrode and a ground voltage, and controls plasma distribution within the plasma chamber by providing resonance with respect to harmonics associated with the first frequency and by adjusting a ground impedance between the second electrode and the ground voltage. The controller provides the resonance circuit with a capacitance control signal associated with the resonance and switch control signals associated with the ground impedance.

20 Claims, 18 Drawing Sheets

(56) References Cited

U.S. PATENT DOCUMENTS

| | | |
|---|---|---|
| 10,264,662 B2 | 4/2019 | Iwata et al. |
| 10,332,728 B2 | 6/2019 | Okunishi |
| 10,593,516 B2 | 3/2020 | Marakhtanov et al. |
| 10,892,198 B2 | 1/2021 | Rodrigo et al. |
| 10,903,052 B2 | 1/2021 | Kobayashi et al. |
| 2003/0037881 A1* | 2/2003 | Barnes ............... H01J 37/3244 |
| | | 156/345.43 |
| 2008/0179011 A1* | 7/2008 | Collins ............... H01L 21/6831 |
| | | 156/345.43 |
| 2010/0193128 A1* | 8/2010 | Koumura ............... H03H 7/38 |
| | | 118/712 |
| 2020/0402774 A1 | 12/2020 | Yasui et al. |
| 2021/0233750 A1 | 7/2021 | Iizuk |

* cited by examiner

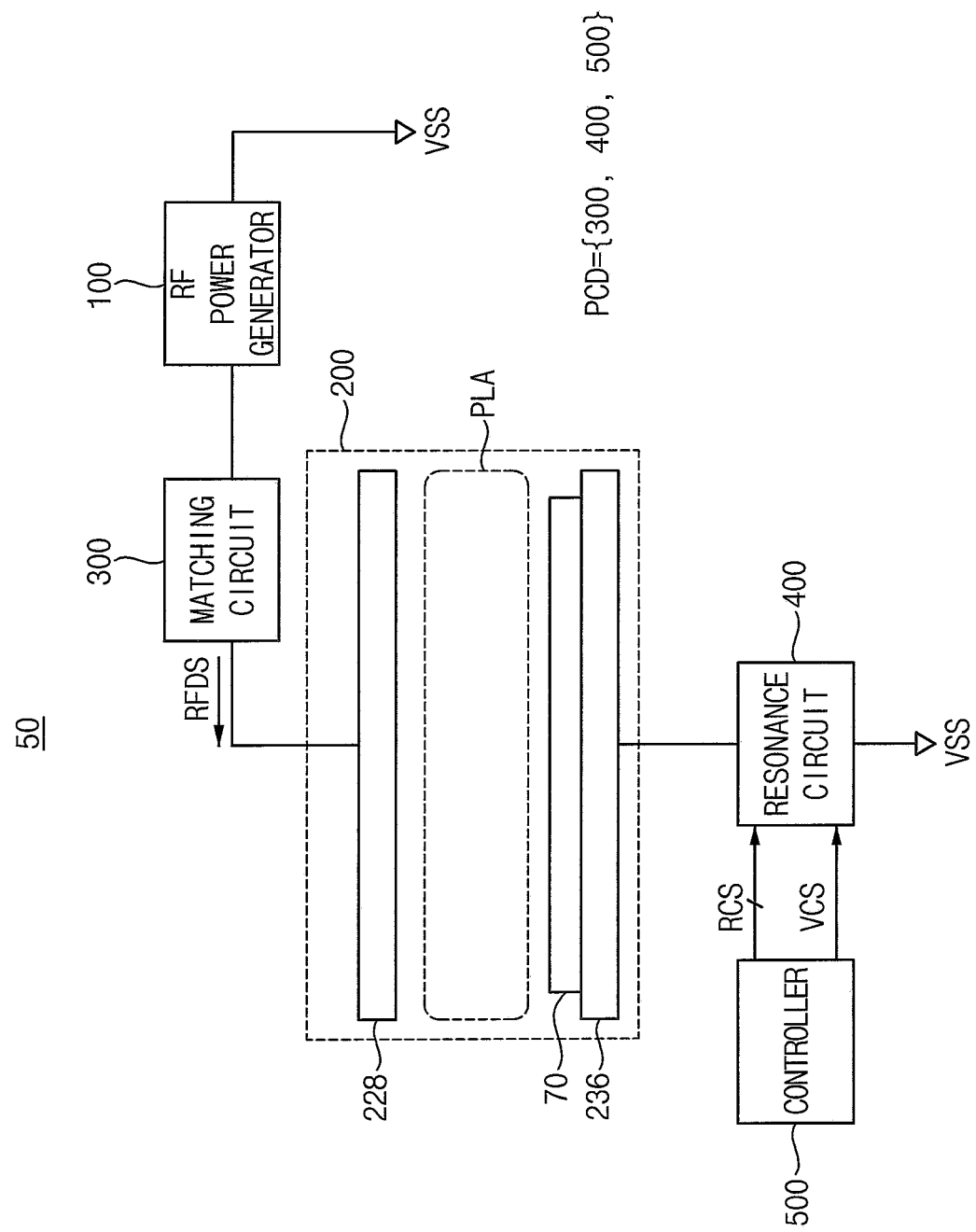

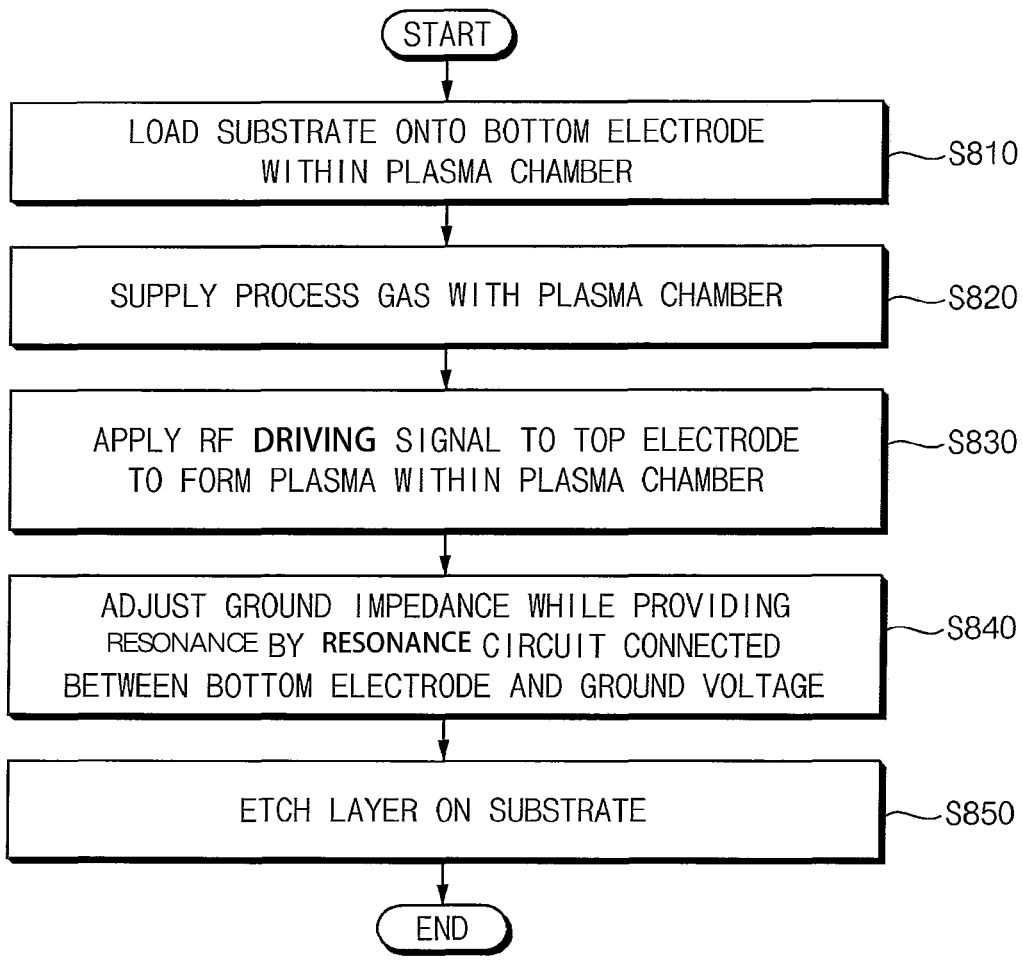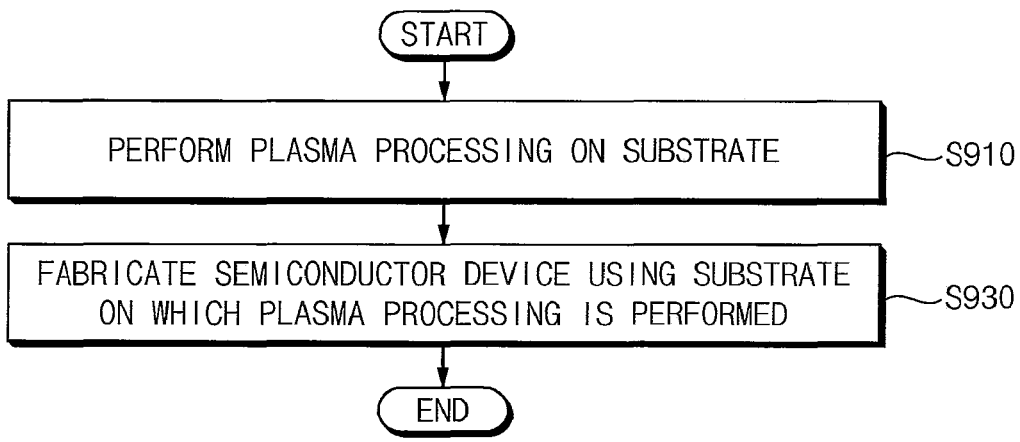

PLASMA CONTROL DEVICE AND PLASMA PROCESSING SYSTEM

CROSS-REFERENCE TO RELATED APPLICATION

This U.S. non-provisional application claims priority under 35 USC § 119 to Korean Patent Application No. 10-2021-0125525, filed on Sep. 23, 2021, in the Korean Intellectual Property Office (KIPO), the disclosure of which is incorporated by reference herein in its entirety.

BACKGROUND

1. Field

Example embodiments relate generally to semiconductor manufacturing processes, and more particularly to a plasma control device and a plasma processing system.

2. Description of the Related Art

Plasma control is increasingly important in semiconductor manufacturing processes using plasma.

SUMMARY

According to an embodiment, a plasma control device includes a matching circuit, a resonance circuit, and a controller. The matching circuit is connected to a first electrode of a plasma chamber including the first electrode and a second electrode, and matches impedance of a radio frequency (RF) power by an RF driving signal with an impedance of the first electrode. The RF driving signal is based on a first RF signal having a first frequency. The resonance circuit is connected between the second electrode and a ground voltage, and controls plasma distribution within the plasma chamber by providing resonance with respect to harmonics associated with the first frequency and by adjusting a ground impedance between the second electrode and the ground voltage. The controller provides the resonance circuit with a capacitance control signal associated with the resonance and switch control signals associated with the ground impedance.

According to an embodiment, a plasma processing system includes a plasma chamber including a first electrode and a second electrode, a radio frequency (RF) power generator, includes a matching circuit, a resonance circuit, and a controller. The RF power generator generates a first RF driving signal based on a first RF signal having a first frequency and a second RF driving signal based on a second RF signal having a second frequency smaller than the first frequency and applies the first RF driving signal and the second RF driving signal to the first electrode. The matching circuit matches impedance of an RF power by the first RF driving signal with an impedance of the first electrode and matches impedance of an RF power by the second RF driving signal with the impedance of the first electrode. The resonance circuit is connected between the second electrode and a ground voltage, and controls plasma distribution within the plasma chamber by providing resonance with respect to harmonics associated with the first frequency and the second frequency and by adjusting a ground impedance between the second electrode and the ground voltage. The controller provides the resonance circuit with a capacitance control signal associated with the resonance and switch control signals associated with the ground impedance.

According to an embodiment, a plasma control device includes a matching circuit, a resonance circuit, and a controller. The matching circuit is connected to a first electrode of a plasma chamber including the first electrode and a second electrode, and matches impedance of a radio frequency (RF) power by an RF driving signal with an impedance of the first electrode. The RF driving signal is based on a first RF signal having a first frequency. The resonance circuit is connected between the second electrode and a ground voltage, and controls plasma distribution within the plasma chamber by providing resonance with respect to harmonics associated with the first frequency and by adjusting a ground impedance between the second electrode and the ground voltage. The controller provides the resonance circuit with a capacitance control signal associated with the resonance and switch control signals associated with the ground impedance. The resonance circuit includes a switching resistor circuit connected between the first node and the ground node. The switching resistor circuit adjusts the ground impedance by providing different resistance value in response to the switch control signals. The switching resistor circuit includes a plurality of resistors connected in parallel with respect to each other to the first node and a plurality of switches connected in parallel with respect to each other to the ground node. Each of the plurality of switches being connected to a corresponding one of the plurality of resistors. Each of the plurality of switches is selectively turned-on in response to a corresponding one of the switch control signals.

BRIEF DESCRIPTION OF THE DRAWINGS

Features will become apparent to those of skill in the art by describing in detail example embodiments with reference to the attached drawings in which:

FIG. 1 is a block diagram illustrating a plasma processing system according to example embodiments.

FIG. 20 is a flowchart illustrating a method of performing plasma processing according to example embodiments.

FIG. 21 is a flowchart illustrating a method of manufacturing a semiconductor device according to example embodiments.

DETAILED DESCRIPTION

Figure 2A:
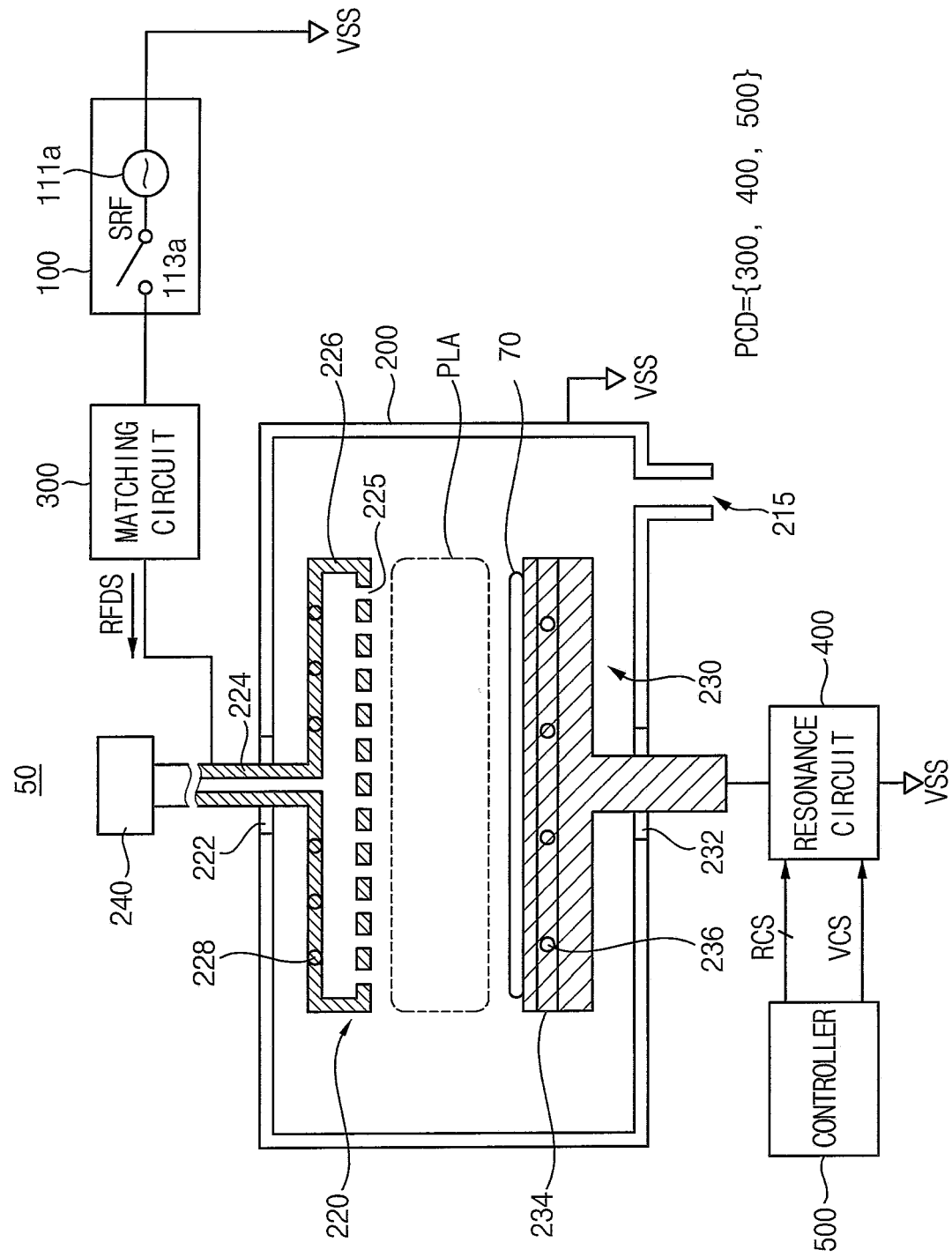
FIG. 2A is a block diagram illustrating the plasma processing system of FIG. 1 in detail according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating a plasma processing system according to example embodiments.

Referring to FIG. 1, a plasma processing system 50 may include a radio frequency (RF) power generator 100, a matching circuit 300, a plasma chamber 200, a resonance circuit 400, and a controller 500.

The matching circuit 300, the resonance circuit 400, and the controller 500 may constitute a plasma control device PCD. In an example embodiment, the plasma control device PCD may further include the RF power generator 100.

The plasma chamber 200 may include an internal space in which an etching process using plasma is performed. The plasma chamber 200 may include a top electrode 228 and a bottom electrode 236. A substrate holder including the bottom electrode 236 may be disposed at a lower portion of the plasma chamber 200, to mount a substrate 70 to be processed.

The plasma chamber 200 may include a hollow metal body having sufficient electrical conductivity, rigidity, and stiffness, so the plasma etching process may be performed at an inside of the hollow metal body.

The RF power generator 100 may generate an RF driving signal RFDS based on an RF signal having a first frequency. The RF power generator 100 may generate the RF power by including an alternating current power source, and may generate the RF driving signal RFDS by switching the RF signal. The RF power generator 100 may be connected to a ground voltage VSS.

The matching circuit 300 may be connected between the RF power generator 100 and the top electrode 228, and may match impedance of an RF power by the RF driving signal RFDS with an impedance of the top electrode 228 to maximize transmission power.

The resonance circuit 400 may be connected between the bottom electrode 236 and the ground voltage VSS. The resonance circuit 400 may control plasma distribution within the plasma chamber 200 by providing resonance with respect to harmonics associated with the first frequency, and by adjusting a ground impedance between the bottom electrode 236 and the ground voltage VSS.

The controller 500 may generate a capacitance control signal VCS associated with the resonance, may generate switch control signals RCS associated with the ground impedance, and may provide the resonance circuit 400 with the capacitance control signal VCS and the switch control signals RCS.

In FIG. 1, the top electrode 228 may correspond to (or, may be referred to as) a first electrode, and the bottom electrode 236 may correspond to (or, may be referred to as) a second electrode.

FIG. 2A is a block diagram illustrating the plasma processing system of FIG. 1 in detail according to example embodiments.

Referring to FIG. 2A, the RF power generator 100 may include an oscillator 111a and a pulse switch 113a.

The oscillator 111a may be connected to the ground voltage VSS, and may generate a RF signal SRF having a first frequency. The pulse switch 113a may apply the RF driving signal RFDS to the top electrode 228 by switching the RF signal SRF.

The plasma chamber 200 may include a source supplier 220 disposed at an upper portion of the plasma chamber 200, and a substrate holder 230 disposed at a lower portion of the plasma chamber 200 to mount the substrate 70 to be processed A source tube 224, in which the source gases for the etching process flow, may penetrate through an upper portion of the plasma chamber 200, and a protrusion portion of the substrate holder 230 may penetrate through a bottom portion of the plasma chamber 200.

An upper insulator 222 may be disposed between the source tube 224 and an upper plate of the plasma chamber 200. A lower insulator 232 may be disposed between the protrusion of the substrate holder 230 and a bottom plate of the plasma chamber 200. Thus, an inside of the plasma chamber 200 may be insulated from an outside of the plasma chamber 200. A chamber gate may be positioned at a sidewall of the plasma chamber 200, and the substrate 70 may be loaded into or unloaded from the plasma chamber 200 through the chamber gate. The plasma chamber 200 may be electrically grounded by a ground member in the plasma etching process.

An exhaust port 215 may be positioned at a bottom of the plasma chamber 200. The exhaust port 215 may be connected to a vacuum pump (not shown) and byproducts of the etching process and residuals of the source gases may be exhausted from the plasma chamber 200 through the exhaust port 215.

The source supplier 220 may be connected to a source reservoir 240, and the source gases for the plasma etching process may be supplied into the plasma chamber 200 by the source supplier 220 to generate etching plasma PLA.

The source supplier 220 may include the source tube 224, which may transfer the source gases to the plasma chamber 200 from the source reservoir 240, and a shower head 226 connected to the source tube 224 to discharge the source gases over the substrate 70. The top electrode 228 may be positioned in the shower head 226 to apply a source power to the source gases in the plasma chamber 200.

The shower head 226 may include at least one conductive material, and may have plurality of injection holes 225.

The top electrode 228 in the shower head 226 may be connected to the matching circuit 300 via the source tube 224.

The source gases may be supplied into the gas space of the shower head 226 through the source tube 224, and may be supplied into the plasma chamber 200 through the injection holes 225. The source gases may be changed into etching plasma PLA by the powers applied to the top electrode 228 and/or the bottom electrode 236

The substrate holder 230 may be positioned at the bottom of the plasma chamber 200, opposite the source supplier 220. The substrate holder 230 may include an electrostatic chuck (ESC) or a vacuum chuck.

The substrate holder 230 may include an ESC having a susceptor 234 having a plurality of electrodes. The substrate 70 may be secured to the substrate holder 230 by an electrostatic force. The ESC may include a buried electrode generating the electrostatic force, and the bottom electrode 236 for applying the RF power or the ground voltage.

As such, the RF power may be applied to the top electrode 228, and the source gases may be changed into the etching plasma PLA over the substrate 70. Thus, a plasma sheath may be provided between the substrate 70 and the shower head 226 in the plasma chamber 200.

Figure 2B:
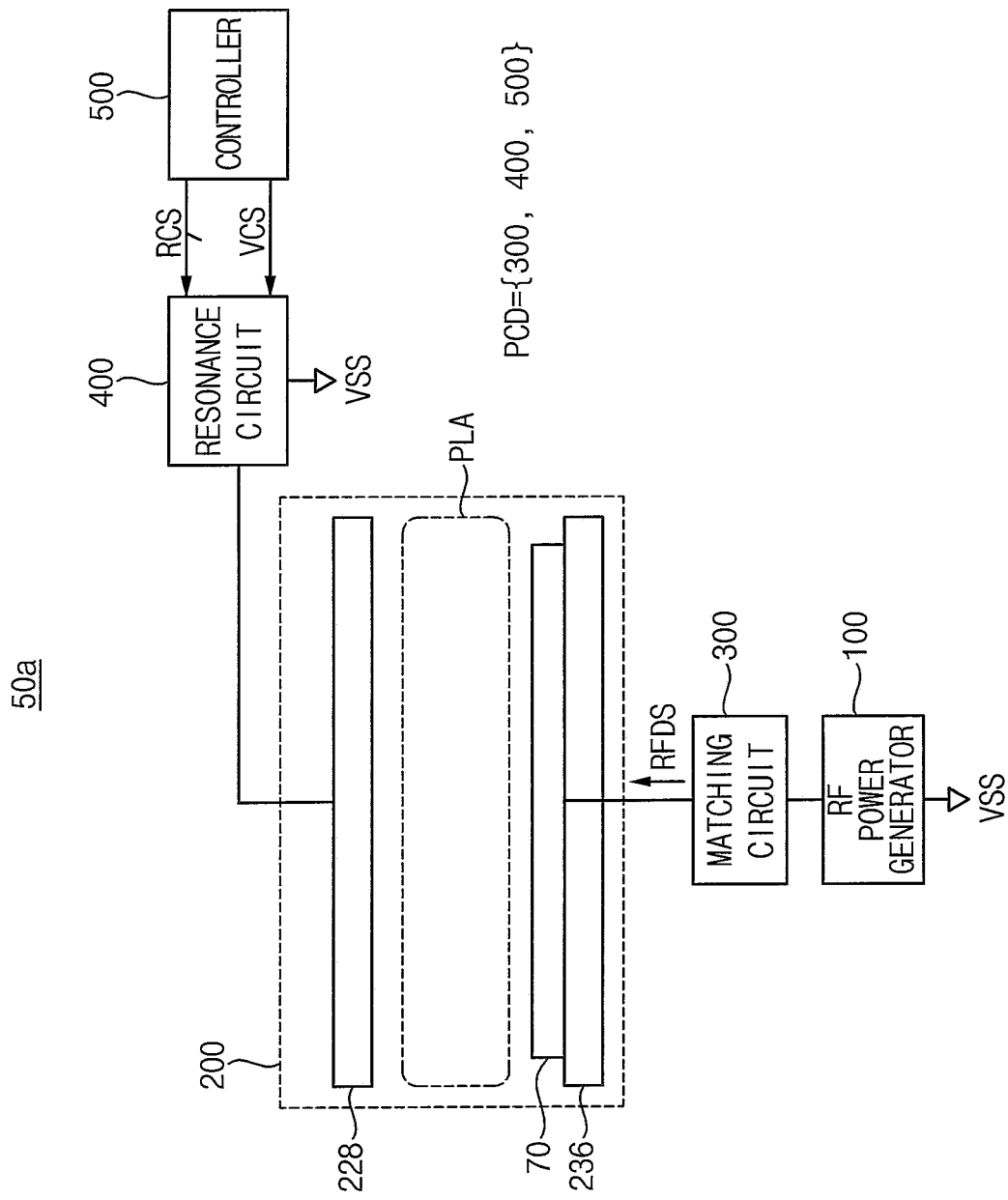
FIG. 2B is a block diagram illustrating a plasma processing system according to example embodiments.

FIG. 2B is a block diagram illustrating a plasma processing system according to example embodiments.

Referring to FIG. 2B, a plasma processing system 50a may include the RF power generator 100, the matching circuit 300, the plasma chamber 200, the resonance circuit 400, and the controller 500.

The plasma processing system 50a of FIG. 2B differs from the plasma processing system 50 of FIG. 2A in that the matching circuit 300 is connected to the bottom electrode 236 of the plasma chamber 200 and applies the RF driving signal RFDS to the bottom electrode 236, and in that the resonance circuit 400 is connected between the top electrode 228 of the plasma chamber 200 and adjusts an impedance between the top electrode 228 and the ground voltage VSS.

In FIG. 2B, the top electrode 228 may correspond to (or, may be referred to as) a second electrode, and the bottom electrode 236 may correspond to (or, may be referred to as) a first electrode.

In the plasma control device PCD according to example embodiments, the RF power generator 100 may generate the RF driving signal RFDS based on the RF signal, the RF power generator 100 may generate the plasma PLA within the plasma chamber 200 by the matching circuit 300 applying the RF driving signal RFDS to the first electrode of the plasma chamber 200, and the resonance circuit 400 (which is connected between the second electrode of the plasma chamber 200 and the ground voltage VSS) may control plasma distribution within the plasma chamber 200 by providing resonance with respect to harmonics associated with frequency of the RF driving signal RFDS, and by adjusting a ground impedance between the second electrode and the ground voltage VSS.

The first electrode may correspond to one of the top electrode 228 and the bottom electrode 236, and the second electrode may correspond to the other of the top electrode 228 and the bottom electrode 236.

Figure 3:
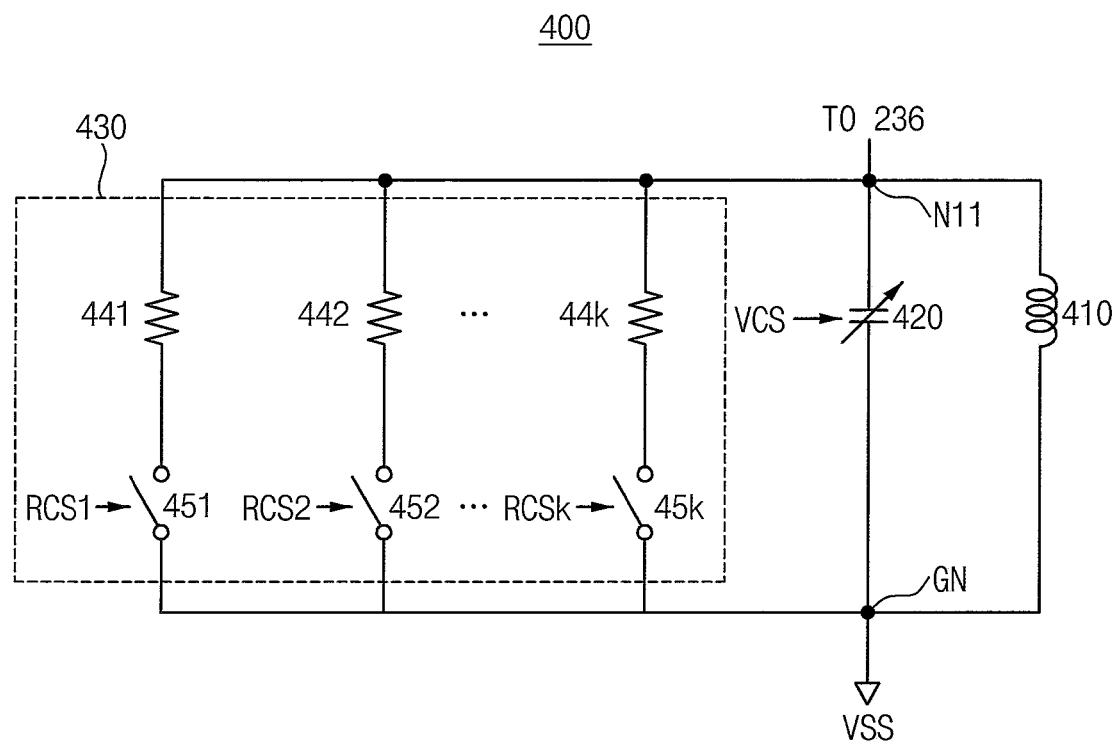
FIG. 3 is a circuit diagram illustrating an example of the resonance circuit in the plasma processing system of FIG. 2A according to example embodiments.

FIG. 3 is a circuit diagram illustrating an example of a resonance circuit in the plasma processing system of FIG. 2A according to example embodiments.

Referring to FIG. 3, the resonance circuit 400 may include an inductor 410, a variable capacitor 420, and a switching resistor circuit 430, all of which are connected in parallel with respect to each other between a first node N11 (coupled to the bottom electrode 236) and a ground node GN (coupled to the ground voltage VSS).

The inductor 410 may be connected between the first node N11 and the ground node GN, and may have a fixed inductance. The inductor 410 may be configured to provide an inductance of 0.5 µH to 10 µH.

The variable capacitor 420 may be connected between the first node N11 and the ground node GN in parallel with the inductor 410. The variable capacitor 420 may have an upper electrode coupled to the first node N11 and a lower electrode coupled to the ground node GN. The variable capacitor 420 may be configured to provide a capacitance ranging from 50 pF to 1000 pF. The variable capacitor 420 may be implemented with a vacuum variable capacitor that adjusts a capacitance by adjusting a gap between the upper electrode and the lower electrode, in response to the capacitance control signal VCS.

The switching resistor circuit 430 may be connected between the first node N11 and the ground node GN in parallel with the variable capacitor 420. The switching resistor circuit 430 may include a plurality of resistors 441, 442, . . . , 44k, which are connected in parallel with respect to each other to the first node N11, and a plurality of switches 451, 452, . . . , 45k connected in parallel with respect to each other to the ground node GN. Each of the plurality of switches 451, 452, . . . , 45k may be connected in series to a corresponding one of the plurality of resistors 441, 442, . . . , 44k. Here, k is an integer greater than two.

Respective ones of the plurality of resistors 441, 442, . . . , 44k may have a different resistance value. For example, the respective ones of the plurality of resistors 441, 442, . . . , 44k may have a different one of resistance values from 1 kΩ to 10 kΩ.

Each of the plurality of switches 451, 452, . . . , 45k may be selectively turned-on in response to a corresponding one of switch control signals RCS1, RCS2, . . . , RCSk.

The switching resistor circuit 430 may adjust the ground impedance between the bottom electrode 236 and the ground voltage VSS by providing different resistance value in response to the switch control signals RCS1, RCS2, . . . , RCSk.

When the inductor 410 and the variable capacitor 420 provides a resonance with respect to harmonics associated with the first frequency of the RF driving signal RFDS applied to the first electrode of the plasma chamber 200, the ground impedance of the resonance circuit 400 may be determined only by the resistance value provided by the switching resistor circuit 430. It is noted that a resonance frequency of the resonance provided by the resonance circuit 400 is determined by an inductance of the inductor 410 and a capacitance of the variable capacitor 420.

Therefore, the resonance circuit 400 may satisfy a resonance condition by adjusting the capacitance of the variable capacitor 420, which is easily adjustable, and may adjust the ground impedance by adjusting the resistance value provided by the switching resistor circuit 430. Accordingly, the resonance circuit 400 may easily adjust the resistance value by adjusting the switching resistor circuit 430 when a characteristic of the plasma chamber 200 changes. In addition, the resonance circuit 400 may easily adjust plasma distribution within the plasma chamber 200, which is adjusted based on the ground impedance between the bottom electrode 236 and the ground voltage VSS.

Figure 4:
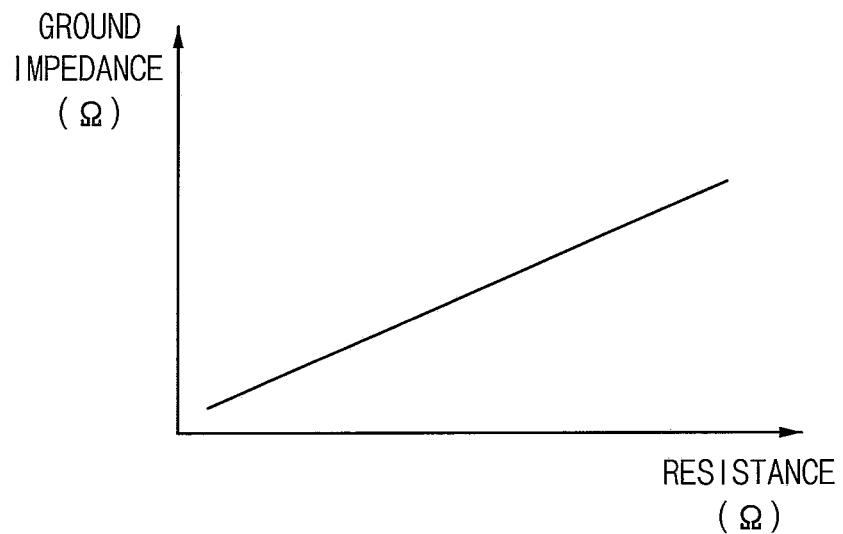
FIG. 4 is a graph showing a relationship between a resistance value provided by the switching resistor circuit and an impedance of the resonance circuit when the resonance circuit of FIG. 3 provides a resonance.

FIG. 4 is a graph showing a relationship between a resistance value provided by the switching resistor circuit and an impedance of the resonance circuit when the resonance circuit of FIG. 3 provides a resonance.

In FIG. 4, a horizontal axis denotes a resistance value (which the switching resistor circuit 430 provides when the resonance occurs) and a vertical axis denotes an impedance of the resonance circuit 400 according to a change of the resistance value.

Referring to FIG. 4, as the resistance value (which the switching resistor circuit 430 provides when the resonance occurs) increases, the impedance of the resonance circuit 400 linearly increases.

Therefore, the resonance circuit 400 may decrease a distribution difference of an electric field within the plasma chamber 200 by adjusting the resistance value provided by the switching resistor circuit 430 when the resonance occurs. In response to decreasing the distribution difference of an electric field within the plasma chamber 200, the resonance circuit 400 may increase uniformity of the plasma distribution within the plasma chamber 200.

Figure 5:
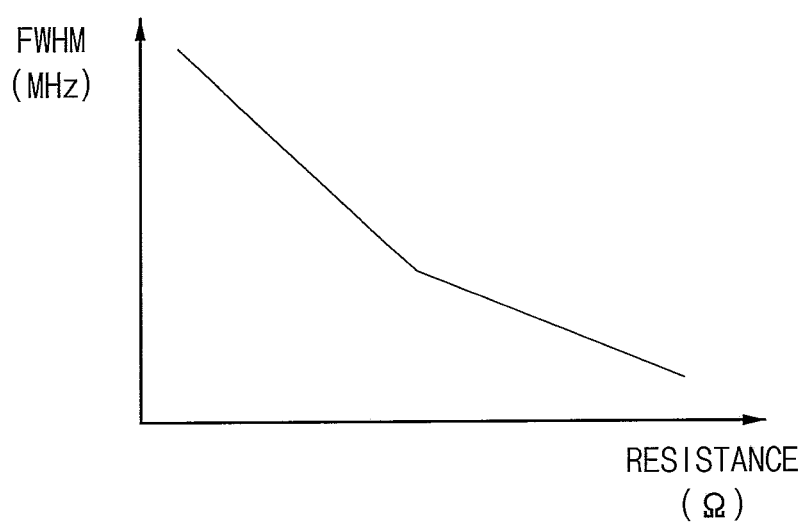
FIG. 5 is a graph showing a relationship between a resistance value provided by the switching resistor circuit and a full width half maximum (FWHM) of a resonance frequency when the resonance circuit of FIG. 3 provides a resonance.

FIG. 5 is a graph showing a relationship between a resistance value provided by the switching resistor circuit and a full width half maximum (FWHM) of a resonance frequency when the resonance circuit of FIG. 3 provides a resonance.

In FIG. 5, a horizontal axis denotes a resistance value (which the switching resistor circuit 430 provides when the resonance occurs) and a vertical axis denotes a FWHM of a resonance frequency according to a change of the resistance value.

Referring to FIG. 5, as the resistance value (which the switching resistor circuit 430 provides when the resonance occurs) decreases, the FWHM of the resonance frequency increases. Therefore, the resonance circuit 400 may reduce sensitivity of the plasma chamber 200 by adjusting the resistance value provided by the switching resistor circuit 430 when the resonance occurs.

Figure 6:
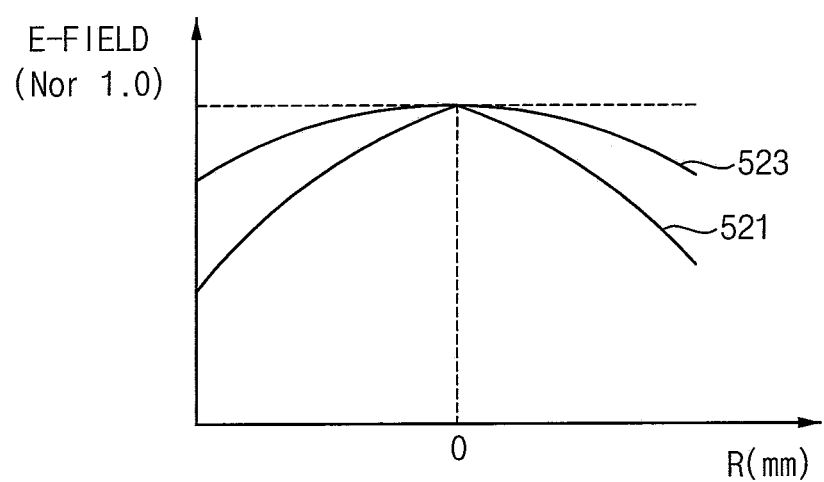
FIG. 6 is a graph showing an intensity of an electric field on a wafer within the plasma chamber.

FIG. 6 is a graph showing an intensity of an electric field on a wafer within the plasma chamber.

In FIG. 6, a horizontal axis denotes a radius of a wafer and a vertical axis denotes an intensity of an electric field on the wafer. The intensity of the electric field has a normalized value (Nor).

In FIG. 6, a reference numeral 521 denotes a first case in which the resonance circuit 400 is not connected between the bottom electrode 236 and the ground voltage VSS, and a reference numeral 523 denotes a second case in which the resonance circuit 400 is connected between the bottom electrode 236 and the ground voltage VSS.

Referring to FIG. 6, as the radius of the wafer increases, a change of the intensity of the electric field associated with the second case (in which the resonance circuit 400 is connected between the bottom electrode 236 and the ground voltage VSS) is reduced, when the second case is compared with the first case (in which the resonance circuit 400 is not connected between the bottom electrode 236 and the ground voltage VSS).

Figure 7:
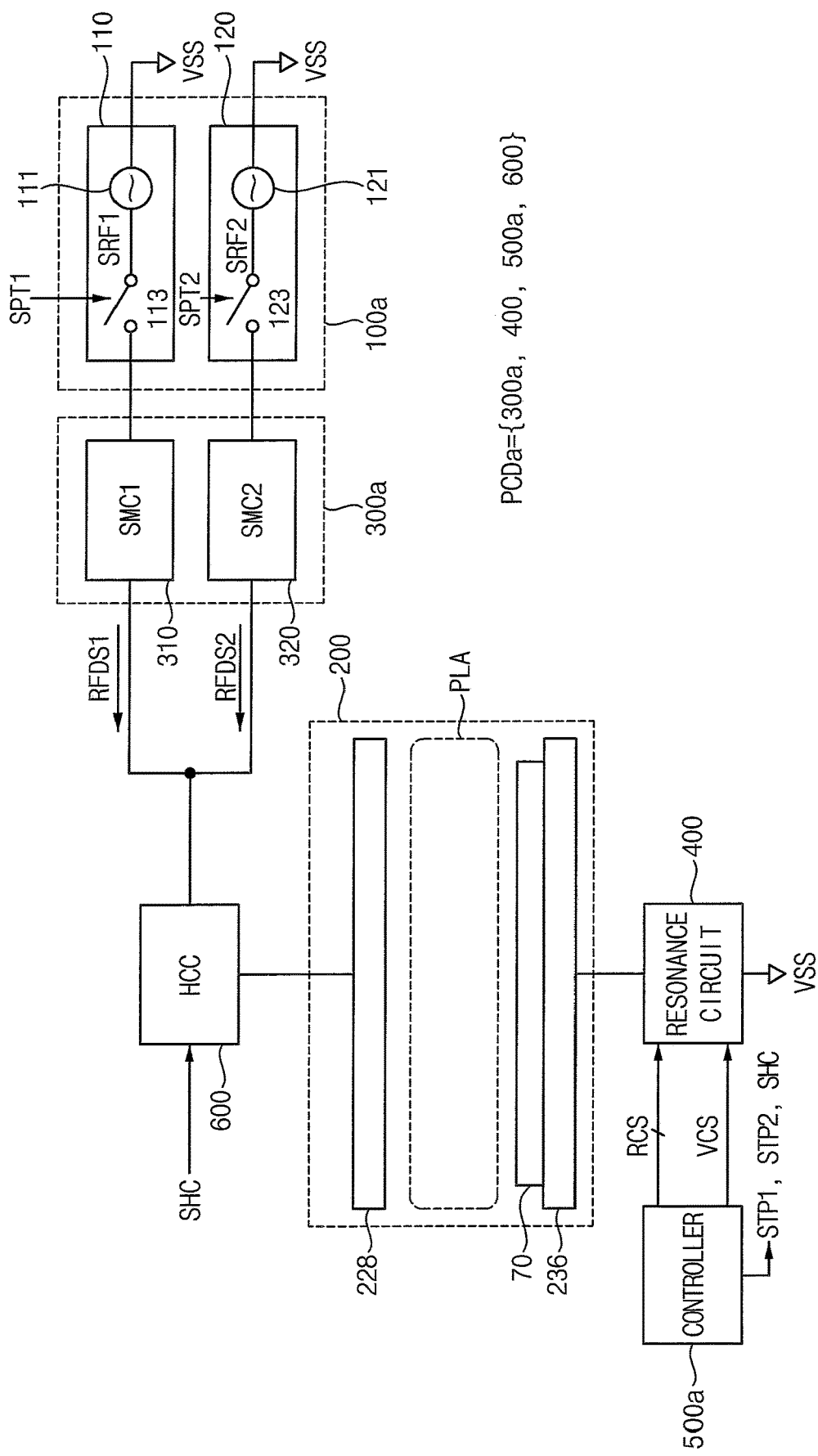
FIG. 7 is a block diagram illustrating a plasma processing system according to example embodiments.

FIG. 7 is a block diagram illustrating a plasma processing system according to example embodiments.

Referring to FIG. 7, a plasma processing system 50b may include an RF power generator 100a, a matching circuit 300a, a harmonic control circuit 600, the plasma chamber 200, the resonance circuit 400, and a controller 500a.

The plasma chamber 200 may include the internal space in which the etching process using plasma is performed. The plasma chamber 200 may include the top electrode 228 and the bottom electrode 236. The substrate holder may include the bottom electrode 236, which may be disposed at the lower portion of the plasma chamber 200 to mount the substrate 70 to be processed. Additional description set forth above with respect to FIG. 2A will be omitted.

The matching circuit 300a, the harmonic control circuit 600, the resonance circuit 400, and the controller 500a may constitute a plasma control device PCDa. In an example embodiment, the plasma control device PCDa may further include the RF power generator 100a.

The RF power generator 100a may include a first RF generator 110 and a second RF generator 120.

The first RF generator 110 may include an oscillator 111 and a first pulse switch 113. The oscillator 111 may be connected to the ground voltage VSS, and may generate a first RF signal SRF1 having a first frequency. The first pulse switch 113 may apply a first RF driving signal RFDS1 to the top electrode 228 by switching the first RF signal SRF1 in response to a first pulse timing signal SPT1.

The second RF generator 120 may include an oscillator 121 and a second pulse switch 123. The oscillator 121 may be connected to the ground voltage VSS, and may generate a second RF signal SRF2 having a second frequency. The second pulse switch 123 may apply a second RF driving signal RFDS2 to the top electrode 228 by switching the second RF signal SRF2 in response to a second pulse timing signal SPT2.

The matching circuit 300a may include a first sub matching circuit (SMC1) 310 and a second sub matching circuit (SMC2) 320.

The first sub matching circuit 310 may be connected between the first RF generator 110 and the top electrode 228, and may match impedance of an RF power by the first RF driving signal RFDS1 with an impedance of the top electrode 228 to maximize transmission power. The second sub matching circuit 320 may be connected between the second RF generator 120 and the top electrode 228, and may match impedance of an RF power by the second RF driving signal RFDS2 with the impedance of the top electrode 228 to maximize transmission power.

The first frequency may be relatively high, for controlling plasma density, and the second frequency may be relatively low, for controlling ion energy. For example, the first frequency may have a frequency ranging from several MHz to several tens of MHz, and the second frequency may have a frequency ranging from several hundreds of a kHz to several MHz.

The resonance circuit 400 may be connected between the bottom electrode 236 and the ground voltage VSS. The resonance circuit 400 may control plasma distribution within the plasma chamber 200 by providing resonance with respect to harmonics associated with the first frequency and the second frequency, and by adjusting a ground impedance between the bottom electrode 236 and the ground voltage VSS.

The controller 500a may generate the capacitance control signal VCS associated with the resonance and switch control signals RCS associated with the ground impedance, and may provide the resonance circuit 400 with the capacitance control signal VCS and the switch control signals RCS.

In addition, the controller 500a may generate the first pulse timing signal SPT1 and the second pulse timing signal SPT2, and may provide the first pulse timing signal SPT1 and the second pulse timing signal SPT2 to the RF power generator 100a. The pulse timing signal SPT1 may be associated with controlling timing of first pulses included in the first RF driving signal RFDS1. The second pulse timing signal SPT2 may be associated with controlling timing of second pulses included in the second RF driving signal RFDS2.

In addition, the controller 500a may generate a harmonic control signal SHC including harmonic control pulses based on timings of the first pulses and the second pulses, and may provide the harmonic control signal SHC to the harmonic control circuit 600.

The harmonic control circuit 600 may be connected between matching circuit 300a and the top electrode 228. The harmonic control circuit 600 may be driven based on the harmonic control signal SHC to reduce harmonic components generated by the first RF driving signal RFDS1 and the second RF driving signal RFDS2.

In another implementation (not illustrated), the harmonic control circuit 600 may be connected to the bottom electrode 236 and the resonance circuit 400 may be connected to the top electrode 228.

Figure 8:
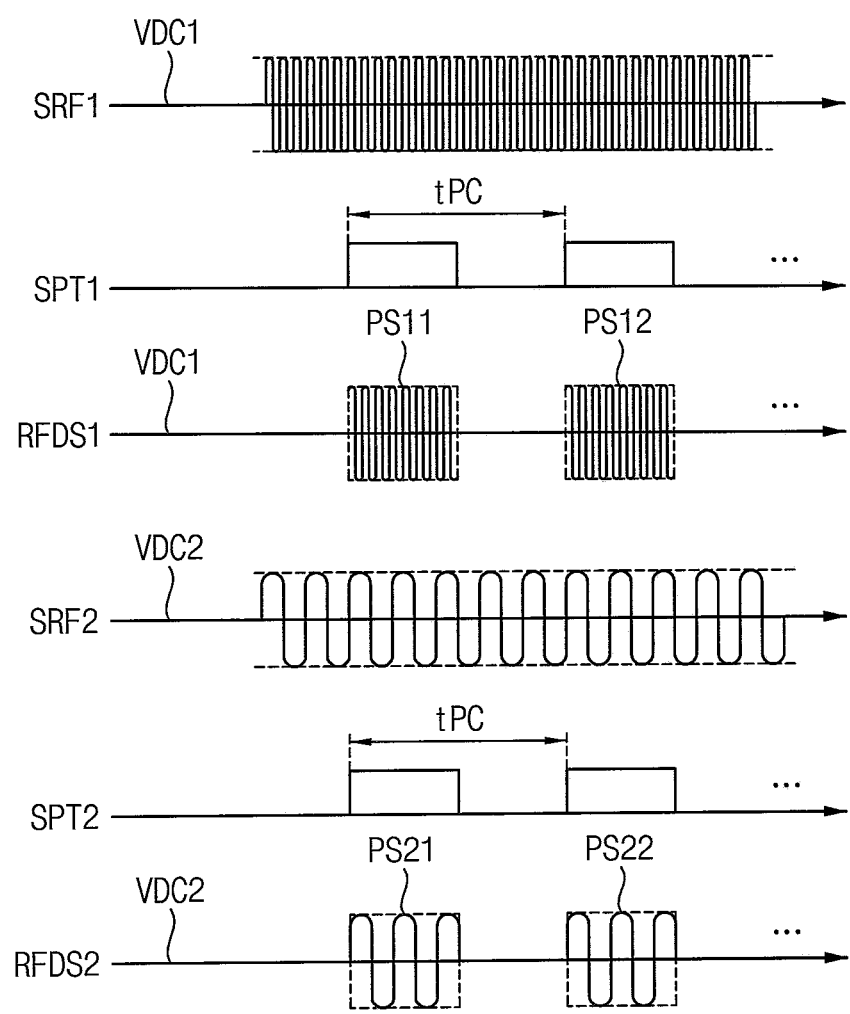
FIG. 8 is a diagram illustrating an example embodiment of generating RF driving signals.

FIG. 8 is a diagram illustrating an example embodiment of generating RF driving signals.

Referring to FIGS. 7 and 8, the first oscillator 111 may generate the first RF signal SRF1 that oscillates with the first frequency, with a first DC voltage VDC1 as a center. The second oscillator 121 may generate the second RF signal SRF2 that oscillates with the second frequency, with a second DC voltage VDC2 as a center.

As described above, the first frequency may be relatively high for controlling plasma density, and the second frequency may be relatively low for controlling ion energy.

The first pulse switch 113 may switch the first RF signal SRF1 in response to the first pulse timing signal SPT1 to generate the first RF driving signal RFDS1 including first pulses PS11 and PS12. In other words, the first pulse switch 113 may generate the first pulses PS11 and PS12 of the first RF driving signal RFDS1 such that the first pulse switch 113 is turned on to pass the first RF signal SRF1 while the first pulse timing signal SPT1 is in a first logic level (e.g., a logic high level) and first pulse switch 113 is turned off to block the first RF signal SRF1 while the first pulse timing signal SPT1 is in a second logic level (e.g., a logic low level).

The second pulse switch 123 may switch the second RF signal SRF2 in response to the second pulse timing signal SPT2 to generate the second RF driving signal RFDS2 including second pulses PS21 and PS22. In other words, the second pulse switch 123 may generate the second pluses PS21 and PS22 of the second RF driving signal RFDS2 such that the second pulse switch 123 is turned on to pass the second RF signal SRF2 while the second pulse timing signal SPT2 is in a first logic level (e.g., a logic high level) and the second pulse switch 123 is turned off to block the second RF signal SRF2 while the second pulse timing signal SPT2 is in a second logic level (e.g., a logic low level).

Figure 9:
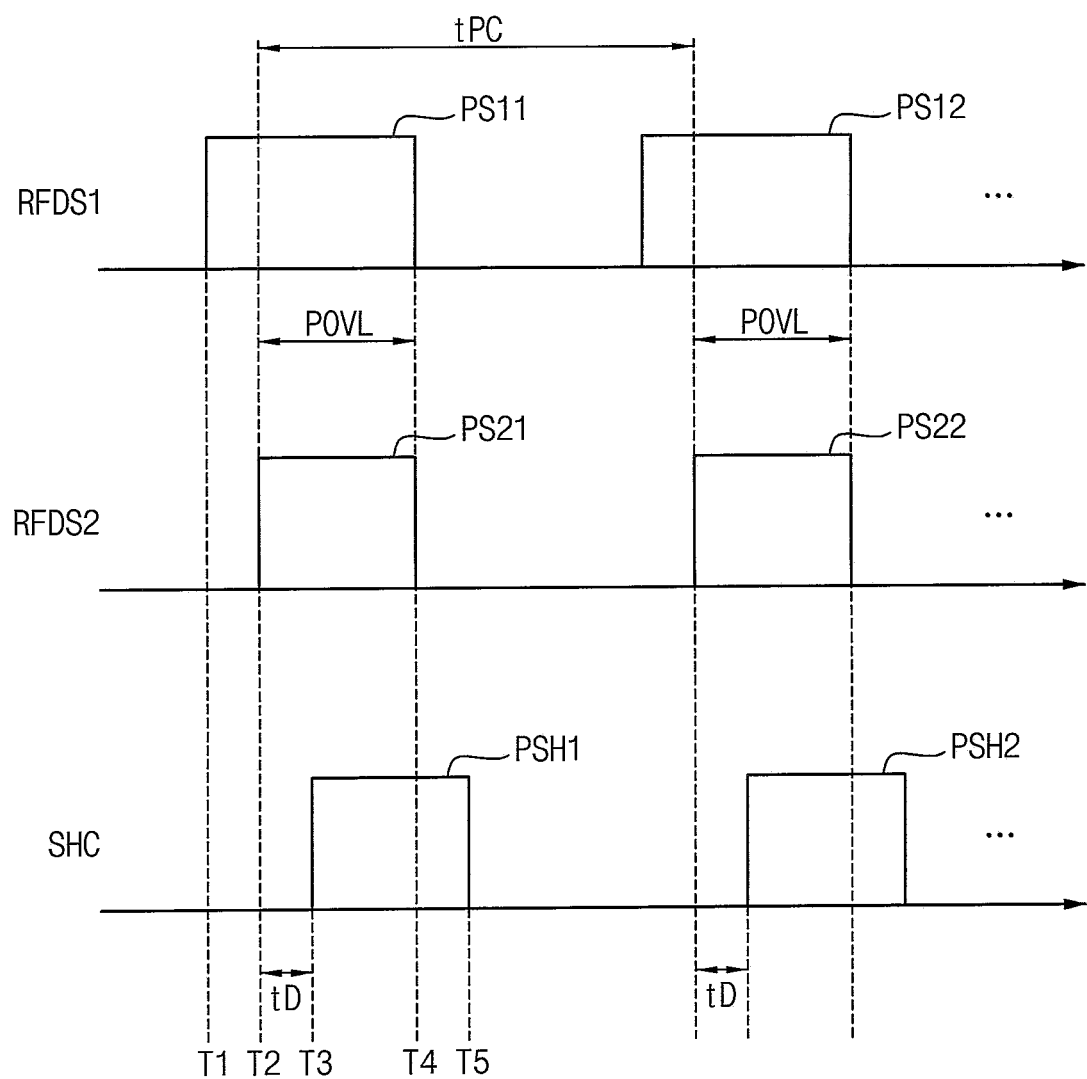
FIG. 9 illustrates examples of a first RF driving signal, a second RF driving signal and a harmonic control signal according to example embodiments.

FIG. 9 illustrates examples of a first RF driving signal, a second RF driving signal, and a harmonic control signal according to example embodiments.

FIG. 9 illustrates example timings of the first RF driving signal RFDS1 and the second RF driving signal RFDS2, and timings of the harmonic control signal SHC based on the timings of the first RF driving signal RFDS1 and the second RF driving signal RFDS2.

Referring to FIGS. 7 and 9, the controller 500a may control the timings of the first RF driving signal RFDS1 and the second RF driving signal RFDS2 such that the first pulse PS11 is activated at a time point T1 and deactivated at a time point T4, and the second pulse PS21 is activated at a time point T2 and deactivated at the time point T4.

In addition, the controller 500a may control the timings of the harmonic control signal SHC such that a harmonic control pulse PSH1 is activated at a time point T3, which is after a delay time tD from the time point T2 that corresponds to a start time point of an overlapping period POVL of the first pulse PS11 and the second pulse PS21.

FIG. 9 illustrates that the harmonic control pulse PSH1 is deactivated at a time point T5 after the end time point of the overlapping period POVL, but the harmonic control pulse PSH1 may be deactivated at, e.g., the time point T4 when the first pulse PS11 and the second pulse PS21 are deactivated.

The first pulses PS11 and PS12, the second pulses PS21 and PS22, and the harmonic control pulses PSH1 and PSH2 may have an equal pulse frequency, i.e., an equal pulse cyclic period tPC. Accordingly, the timing relation between the first pulse PS12, the second pulse PS22, and the harmonic control pulse PSH2 may be the same as the timing relation between the first pulse PS11, the second pulse PS21, and the harmonic control pulse PSH1.

The delay time tD may be set to be longer than longer than a plasma saturation time, for which the plasma caused by the first pulses PS11 and PS12 and the second pulses PS21 and PS22 in the plasma chamber 200 is saturated. In some example embodiments, the delay time tD may be longer than 5 µs.

As such, the harmonic control signal SHC including the harmonic control pulses PSH1 and PSH2 may be generated based on the timings of the first pulses PS11 and PS12 and the second pulses PS21 and PS22, e.g., by activating the harmonic control pulses PSH1 and PSH2 after the delay time tD from the start time points T2 of the overlapping periods POVL of the first pulses PS11 and PS12 and the second pulses PS21 and PS22.

Figure 10A:
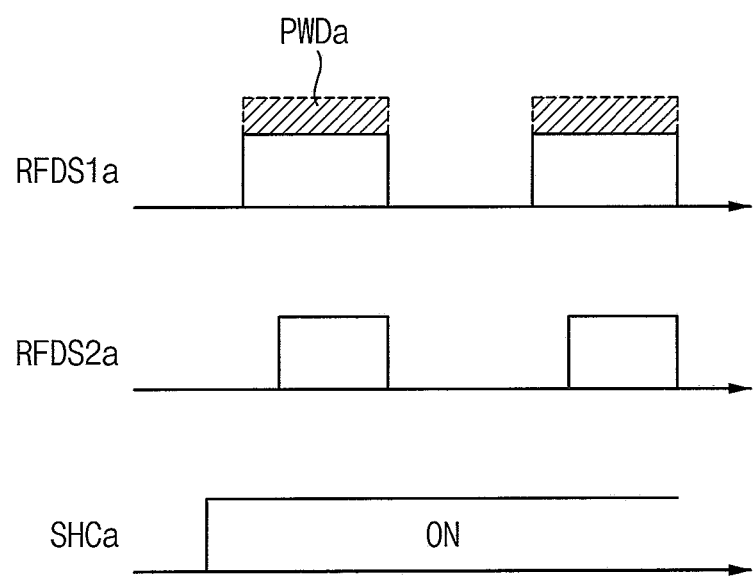
FIG. 10A is a diagram illustrating an example of the harmonic control signal according to a comparative example.
Figure 10B:
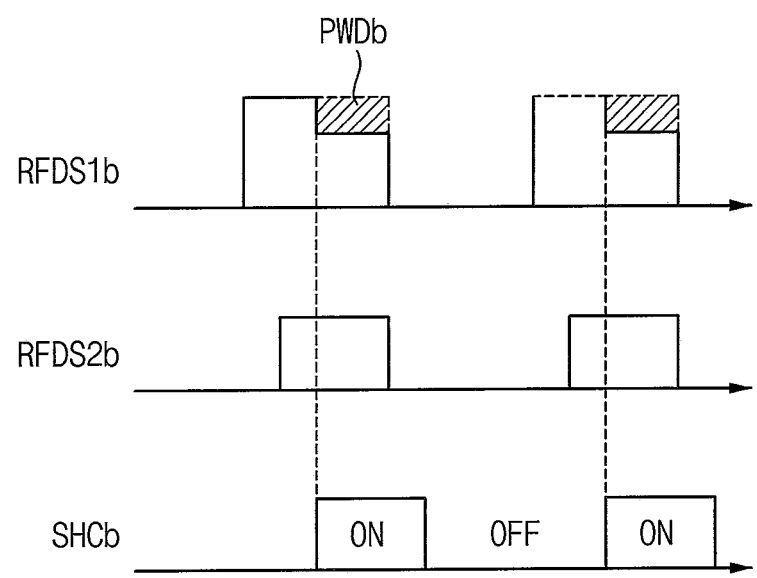
FIG. 10B is a diagram illustrating an example of the harmonic control signal according to example embodiments.

FIG. 10A is a diagram illustrating an example of the harmonic control signal according to a comparative example. FIG. 10B is a diagram illustrating an example of the harmonic control signal according to example embodiments.

FIG. 10A corresponds to a first case that a harmonic control signal SHCa is activated always. FIG. 10B corresponds to a second case that a harmonic control signal SHCb is activated periodically as pulses, as described with reference to FIG. 4.

With reference to both FIG. 10A and FIG. 10B, a first RF driving signal RFDS1a and a second RF driving signal RFDSa of the first case are the same as a first RF driving signal RFDS1b and a second RF driving signal RFDS2b of the second case, and thus the supplied RF power is the same with respect to the first and second cases.

Referring to FIG. 10A, the harmonic control circuit maintains an ON state or an enabled state to activate the harmonic control signal SHCa all the time in the first case.

In contrast, referring to FIG. 10B, the harmonic control circuit may repeat an ON state and an OFF state because the harmonic control signal SHCb is activated and deactivated in the second case.

As a result, the RF power loss of the second case of the harmonic control based on the timings of the RF power supply, i.e., the timings of the first pulses and second RF of the first RF driving signal RFDS1b and the second RF driving signal RFDS2b, may be less than the RF power loss of the first case of the continuous harmonic control.

The harmonic components may be varied depending on the plasma characteristics because the harmonic components are generated by nonlinearity including the plasma sheath. The characteristics of the plasma sheath may depend on the RF pulses of the relatively low frequency. The harmonic component may be defined clearly after the plasma saturation time. If the harmonic control is performed uniformly regardless of the timings of the RF power supply, the unnecessary power loss may be caused and thus the etching rate may be reduced.

As such, according to the present example embodiment, the harmonic component may be switched, i.e., turned on and off periodically, according to the RF pulses. Through the delay time, which is longer than the plasma saturation time with respect to the lower-frequency RF pulses, the harmonic control may be implemented with the loss of the etching rate minimized.

As such, a control of uniformity of plasma and the plasma processing system according to example embodiments may improve uniformity of plasma while reducing loss of the etching rate by controlling the harmonic wave based on timings of the RF driving signals, and by adjusting the ground impedance with a resistance value.

Figure 11:
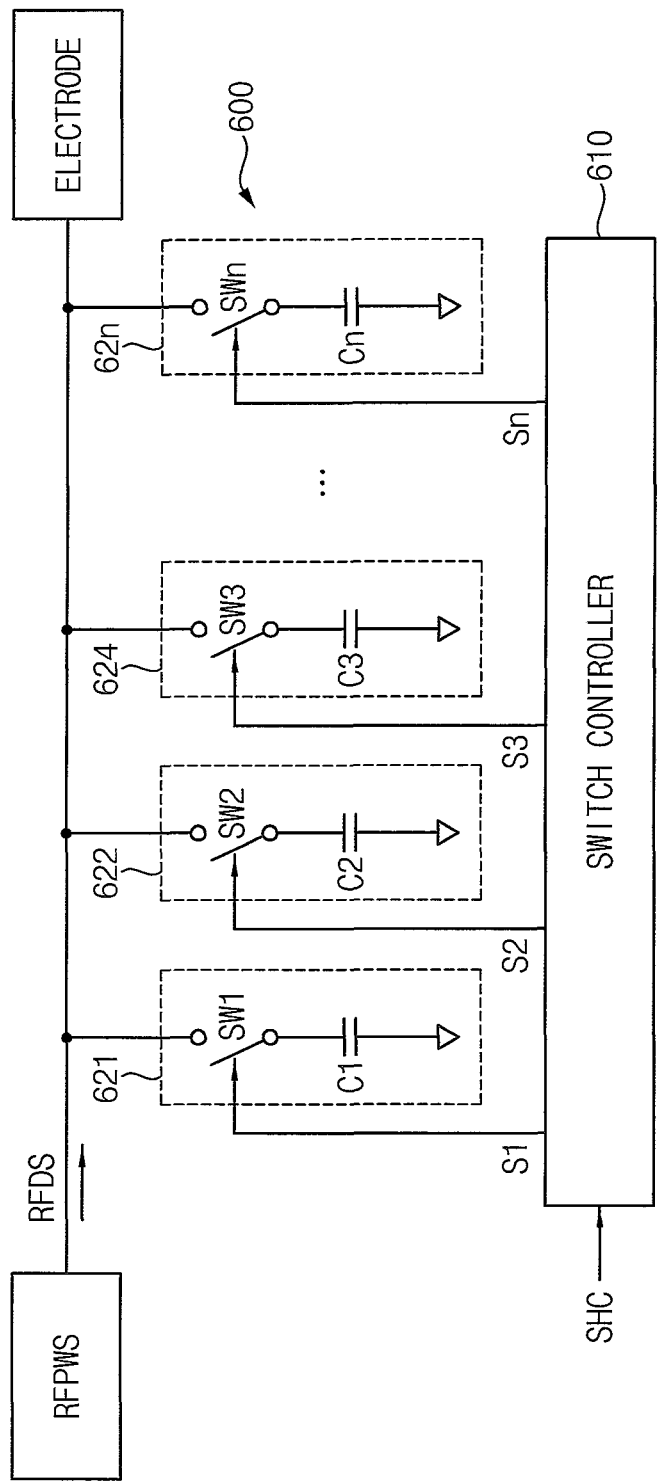
FIG. 11 is a diagram illustrating an example of the harmonic control circuit in the plasma processing system of FIG. 7 according to example embodiments.

FIG. 11 is a diagram illustrating an example of the harmonic control circuit in the plasma processing system of FIG. 7 according to example embodiments.

Referring to FIG. 11, the harmonic control circuit 600 may include a plurality of impedance circuits, e.g., impedance circuits 621, 622, 623, . . . , 62n, and a switch controller 650.

The impedance circuits 621, 622, 623, . . . , 62n may be electrically connected, in response to a plurality of switch signals, e.g., respective switch signals S1, S2, S3, . . . , Sn, to a path through which an RF driving signal RFDS is transferred between an RF power supplier RFPWS and an electrode.

The RF power supplier RFPWS in FIG. 11 corresponds to one of the first RF generator 110 and the second RF generator 120 as described above, and the electrode in FIG. 11 corresponds to one of the top electrode 228 and the bottom electrode 236 as described above.

The switch controller 650 may generate the switch signals S1, S2, S3, . . . , Sn based on the harmonic control signal SHC and a total impedance that is set to reduce the harmonic component.

In some example embodiments, the impedance circuits 621, 622, 623, . . . , 62n may include switches SW1, SW2, SW3, . . . , SWn and loads or capacitors C1, C2, C3, . . . Cn, respectively.

FIG. 11 illustrates an implementation using capacitive loads, i.e., the capacitors C1, C2, C3, . . . Cn, but the loads may be variously selected from, e.g., capacitive loads such as capacitors, inductive loads such as inductors, or various combinations thereof.

The total impedance to reduce the harmonic component may be represented a combination of the switch signals S1, S2, S3, . . . , Sn that are activated in response to the harmonic control signal SHC. For example, if the total impedance is set to C1+C2, the first switch signal S1 and the second switch signal S2 may be activated in response to the harmonic control signal SHC, and the rest of the switch signals S3, . . . , Sn may be deactivated regardless of the harmonic control signal SHC. In this case, the total impedance of C1+C2 may be added to the RF power transfer path periodically in response to the harmonic control signal SHC to provide a leakage path of the harmonic component.

In some example embodiments, the impedances of the loads C1, C2, C3, . . . Cn may be set to be equal, and the total impedance may be represented by multiplication of a unit impedance of each impedance circuit and the number of the impedance circuits that are enabled in response to the harmonic control signal SHC. In other example embodiments, the impedances of at least two of the loads C1, C2, C3, . . . Cn may be set to be different.

Figure 12:
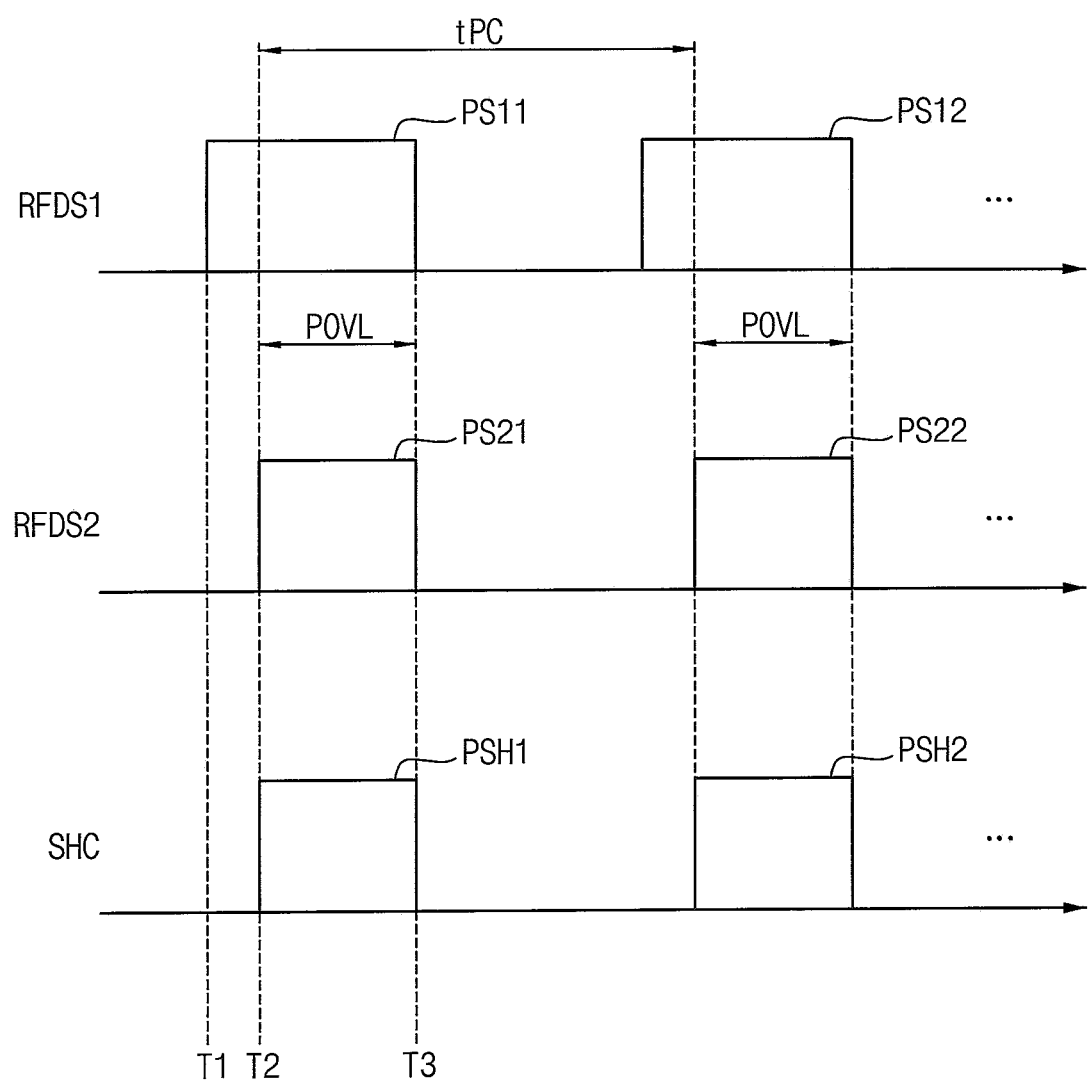
FIGS. 12 and 13 illustrate examples of a first RF driving signal, a second RF driving signal and a harmonic control signal, respectively, according to example embodiments.
Figure 13:
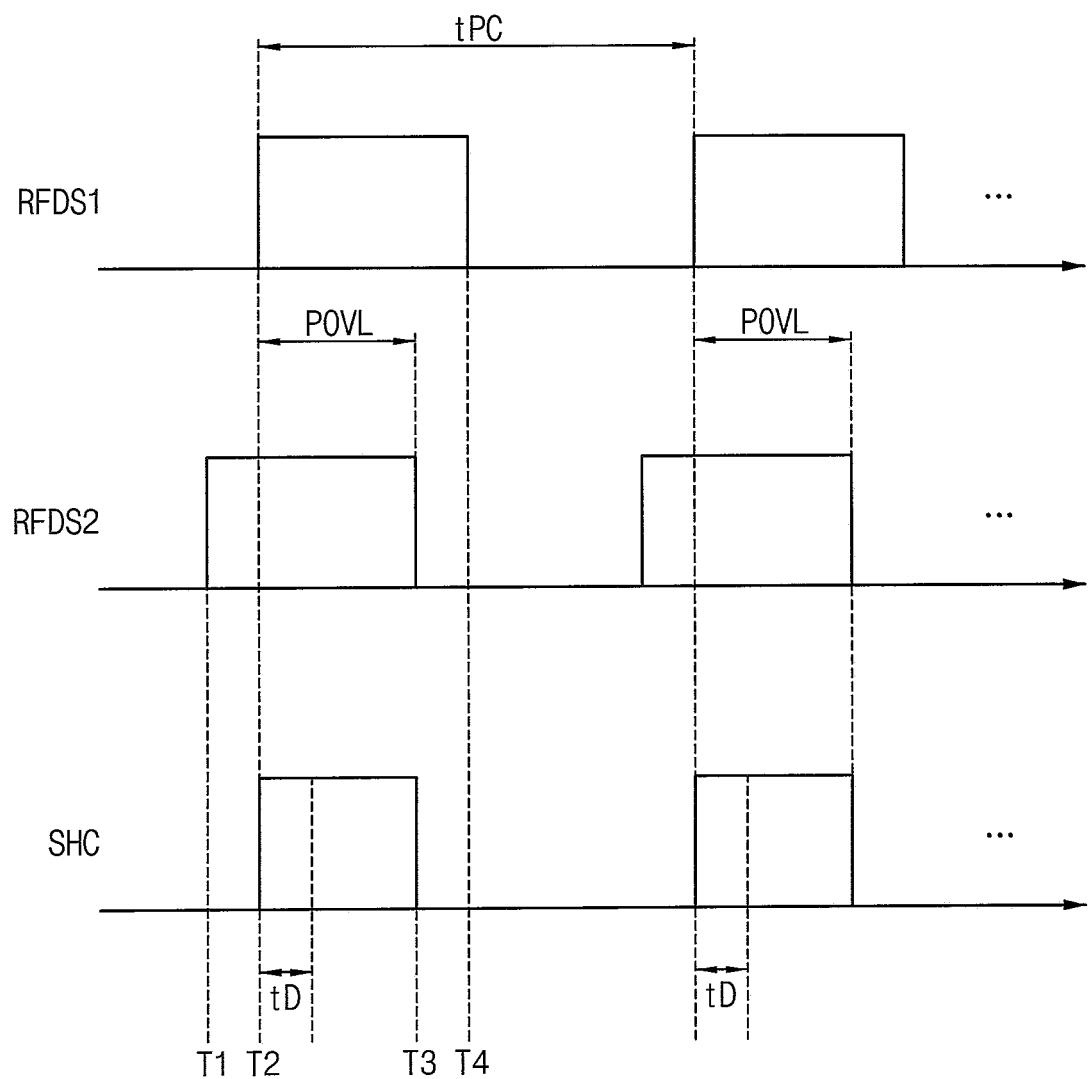

FIGS. 12 and 13 illustrate examples of a first RF driving signal, a second RF driving signal, and a harmonic control signal according to example embodiments.

FIGS. 12 and 13 illustrate example timings of the first RF driving signal RFDS1 and the second RF driving signal RFDS2, and timings of the harmonic control signal SHC based on the timings of the first RF driving signal RFDS1 and the second RF driving signal RFDS2.

Referring to FIGS. 7 and 12, the controller 500a may control the timings of the first RF driving signal RFDS1 such that the first pulse PS11 is activated at a time point T1 and deactivated at a time point T3.

The controller 500a may control the timings of the second RF driving signal RFDS2 such that the second pulse PS21 is activated at a time point T2 and deactivated at the time point T3.

The controller 500a may control the timings of the harmonic control signal SHC such that the harmonic control pulse PSH1 is activated at the time point T2 corresponding to a start time point of an overlapping period POVL of the first pulse PS11 and the second pulse PS21 (i.e., the overlapping period T2 to T3).

FIG. 12 illustrates that the harmonic control pulse PSH1 is deactivated at the time point T3, but the harmonic control pulse PSH1 may be deactivated by a delay time after the time point T3 (when the first pulse PS11 and the second pulse PS21 are deactivated).

The first pulses PS11 and PS12, the second pulses PS21 and PS22, and the harmonic control pulses PSH1 and PSH2 may have an equal pulse frequency, i.e., an equal pulse cyclic period tPC. Accordingly, the timing relation between the subsequent first pulse PS12, the second pulse PS22, and the harmonic control pulse PSH2 may be the same as the timing relation between the first pulse PS11, the second pulse PS21, and the harmonic control pulse PSH1.

As described above, the harmonic control signal SHC (including the harmonic control pulses PSH1 and PSH2) may be generated based on the timings of the first pulses PS11 and PS12 and the second pulses PS21 and PS22, e.g., by activating the harmonic control pulses PSH1 and PSH2 at the start time points T2 of the overlapping periods POVL of the first pulses PS11 and PS12 and the second pulses PS21 and PS22.

Referring to FIGS. 7 and 13, the controller 500a may control the timings of the first RF driving signal RFDS1 such that the first pulse PS11 is activated at a time point T2 and deactivated at a time point T4.

The controller 500a may control the timings of the second RF driving signal RFDS2 such that the second pulse PS21 is activated at a time point T1 and deactivated at a time point T3.

The controller 500a may control the timings of the harmonic control signal SHC such that the harmonic control pulse PSH1 is activated at the time point T2 corresponding to a start time point of an overlapping period POVL of the first pulse PS11 and the second pulse PS21.

According to example embodiments, as described with reference to FIG. 9, the controller 500a may activate the harmonic control pulse PSH1 after the delay time tD from the start time point T2 of the overlapping period POVL of the first pulse PS11 and the second pulse PS21.

As described with reference to FIG. 13, the controller 500a may control the timings of the harmonic control signal SHC such that the harmonic control pulse PSH1 is deactivated at the time point T3 corresponding to the end time point of the overlapping period POVL. As a result, the unnecessary RF power loss may be reduced by setting the activation period of the harmonic control pulse PSH1 based on the overlapping period POVL.

The first pulses PS11 and PS12, the second pulses PS21 and PS22, and the harmonic control pulses PSH1 and PSH2 may have an equal pulse frequency, i.e., an equal pulse cyclic period tPC. Accordingly, the timing relation between the subsequent first pulse PS12, the second pulse PS22, and the harmonic control pulse PSH2 may be the same the timing relation between the first pulse PS11, the second pulse PS21, and the harmonic control pulse PSH1.

As described above, the harmonic control signal SHC (including the harmonic control pulses PSH1 and PSH2) may be generated based on the timings of the first pulses PS11 and PS12 and the second pulses PS21 and PS22, e.g., by activating the harmonic control pulses PSH1 and PSH2 at the start time points T2 of the overlapping periods POVL and deactivating the harmonic control pulses PSH1 and PSH2 at the end time points T3 of the overlapping periods POVL.

Figure 14:
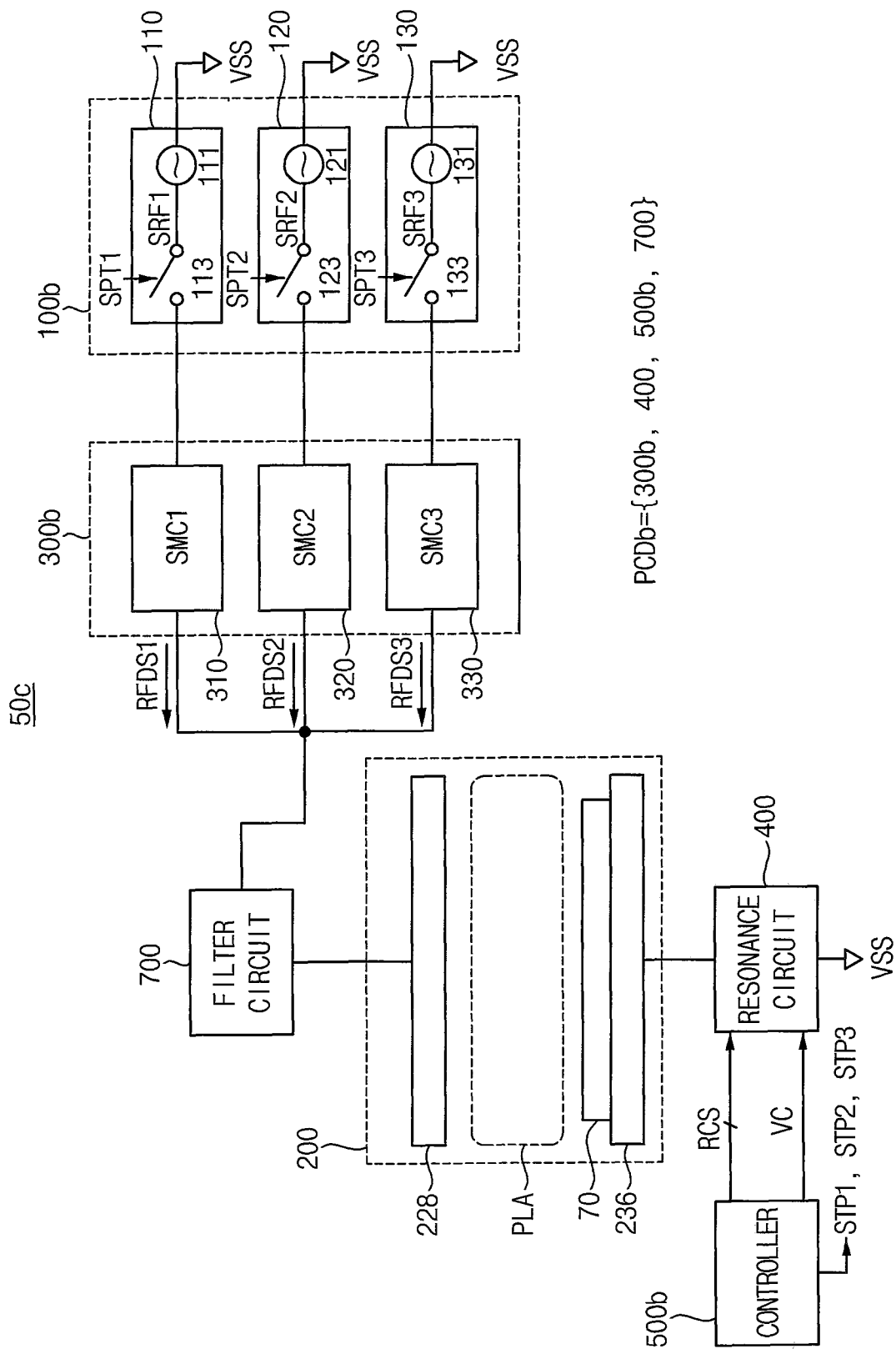
FIG. 14 is a block diagram illustrating a plasma processing system according to example embodiments.

FIG. 14 is a block diagram illustrating a plasma processing system according to example embodiments.

Referring to FIG. 14, a plasma processing system 50c may include an RF power generator 100b, a matching circuit 300b, a filter circuit 700, the plasma chamber 200, the resonance circuit 400, and a controller 500b.

The plasma chamber 200 may include the internal space in which the etching process using plasma is performed. The plasma chamber 200 may include the top electrode 228 and the bottom electrode 236. The substrate holder may include the bottom electrode 236, and may be disposed at the lower portion of the plasma chamber 200 to mount the substrate 70 to be processed. Additional description repeated with FIG. 2A will be omitted.

The matching circuit 300, the filter circuit 700, the resonance circuit 400, and the controller 500b may constitute a plasma control device PCDb. In an example embodiment, the plasma control device PCDb may further include the RF power generator 100b.

The RF power generator 100a may include the first RF generator 110, the second RF generator 120, and a third RF generator 130.

The first RF generator 110 may include the oscillator 111 and the first pulse switch 113. The oscillator 111 may be connected to the ground voltage VSS, and may generate the first RF signal SRF1 having a first frequency. The first pulse switch 113 may apply the first RF driving signal RFDS1 to the top electrode 228 by switching the first RF signal SRF1 in response to the first pulse timing signal SPT1.

The second RF generator 120 may include the oscillator 121 and the second pulse switch 123. The oscillator 121 may be connected to the ground voltage VSS, and may generate the second RF signal SRF2 having a second frequency. The second pulse switch 123 may apply the second RF driving signal RFDS2 to the top electrode 228 by switching the second RF signal SRF2 in response to the second pulse timing signal SPT2.

The third RF generator 130 may include an oscillator 131 and a third pulse switch 133. The oscillator 131 may be connected to the ground voltage VSS and generates a third RF signal SRF3 having a third frequency. The third pulse switch 133 may apply a third RF driving signal RFDS3 to the top electrode 228 by switching the third RF signal SRF3 in response to a third pulse timing signal SPT3.

The matching circuit 300b may include the first sub matching circuit (SMC1) 310, the second sub matching circuit (SMC2) 320, and a third sub matching circuit (SMC3) 330.

The first sub matching circuit 310 may be connected between the first RF generator 110 and the top electrode 228, and may match impedance of an RF power by the first RF driving signal RFDS1 with an impedance of the top electrode 228 to maximize transmission power.

The second sub matching circuit 320 may be connected between the second RF generator 120 and the top electrode 228, and may match impedance of an RF power by the second RF driving signal RFDS2 with the impedance of the top electrode 228 to maximize transmission power.

The third sub matching circuit 330 may be connected between the third RF generator 130 and the top electrode 228, and may match impedance of an RF power by the third RF driving signal RFDS3 with the impedance of the top electrode 228 to maximize transmission power.

The first frequency may be a relatively high for controlling plasma density. The second frequency may be a relatively low for controlling ion energy. For example, the first frequency may have a frequency ranging from several MHz to several tens of MHz. The second frequency may have a frequency ranging from several hundreds of a kHz to several MHz.

The third frequency may be set to strengthen the RF power of the first RF signal SRF1 and/or the RF power of the second RF signal SRF2.

The resonance circuit 400 may be connected between the bottom electrode 236 and the ground voltage VSS. The resonance circuit 400 may control plasma distribution within the plasma chamber 200 by providing resonance with respect to harmonics associated with the first frequency and the second frequency, and by adjusting a ground impedance between the bottom electrode 236 and the ground voltage VSS.

The controller 500a may generate the capacitance control signal VCS associated with the resonance, may generate the switch control signals RCS associated with the ground impedance, and may provide the resonance circuit 400 with the capacitance control signal VCS and the switch control signals RCS.

In addition, the controller 500a may generate the first pulse timing signal SPT1, the second pulse timing signal SPT2, and the third pulse timing signal SPT3, and may provide the first pulse timing signal SPT1, the second pulse timing signal SPT2, and the third pulse timing signal SPT3 to the RF power generator 100b. The pulse timing signal SPT1 may be associated with controlling timing of first pulses included in the first RF driving signal RFDS1. The second pulse timing signal SPT2 may be associated with controlling timing of second pulses included in the second RF driving signal RFDS2. The third pulse timing signal SPT3 may be associated with controlling timing of third pulses included in the third RF driving signal RFDS3.

The filter circuit 700 may be connected between the matching circuit 300b and the top electrode 228. The filter circuit 700 may control harmonics of a very high frequency (VHF) (for example, the first frequency) to adjust the plasma distribution within the plasma chamber 200.

The filter circuit 700 may perform a filtering function that passes only a certain range of frequency of RF power output from the matching circuit 300b. The filter circuit 700 may block the harmonic components output from the matching circuit 300b.

In another implementation (not illustrated), the filter circuit 700 may be connected to the bottom electrode 236, and the resonance circuit 400 may be connected to the top electrode 228.

Figure 15:
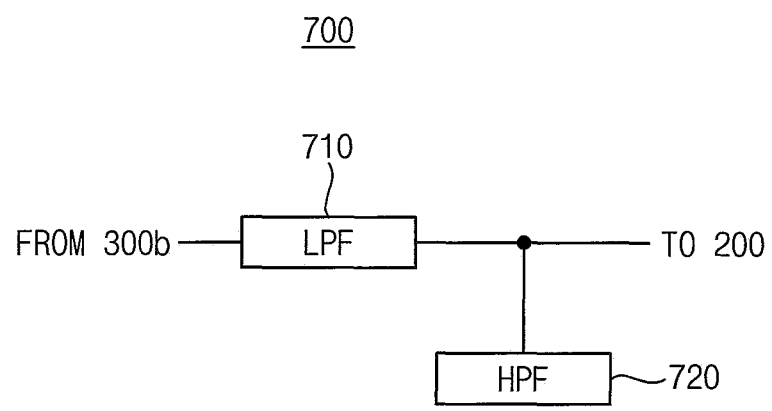
FIG. 15 is a block diagram illustrating an example of the filter circuit in the plasma processing system of FIG. 14 according to example embodiments.

FIG. 15 is a block diagram illustrating an example of the filter circuit in the plasma processing system of FIG. 14 according to example embodiments.

Referring to FIG. 15, the filter circuit 700 may include, e.g., a low pass filter (LPF) 710 and a high pass filter (HPF) 720.

The LPF 710 may be located at an output terminal of the matching circuit 300b, and may pass a fundamental wave of frequencies of each of the first through RF driving signals RFDS1, RFDS2, and RFDS3 from the matching circuit 300b while blocking other wave components. For example, the LPF 710 may block the harmonic components of frequencies of each of the first through RF driving signals RFDS1, RFDS2, and RFDS3.

The HPF 720 may be located between the LPF 710 and the plasma chamber 200. As described above, most of the harmonic components of frequencies of each of the first through RF driving signals RFDS1, RFDS2, and RFDS3 may be blocked by the LPF 710.

However, harmonics may be generated due to the non-linear characteristics of RF power and plasma, and there may be harmonics that are not blocked by the LPF 710. Such harmonics may cause non-uniform plasma distribution in the plasma chamber 200. Therefore, the HPF 720 may help the resonance circuit 400 in producing resonance for harmonics, thus reducing and/or minimizing non-uniform plasma distribution.

In an example embodiment, the filter circuit 700 may include the LPF 710 and may not include the HPF 720.

Figure 16:
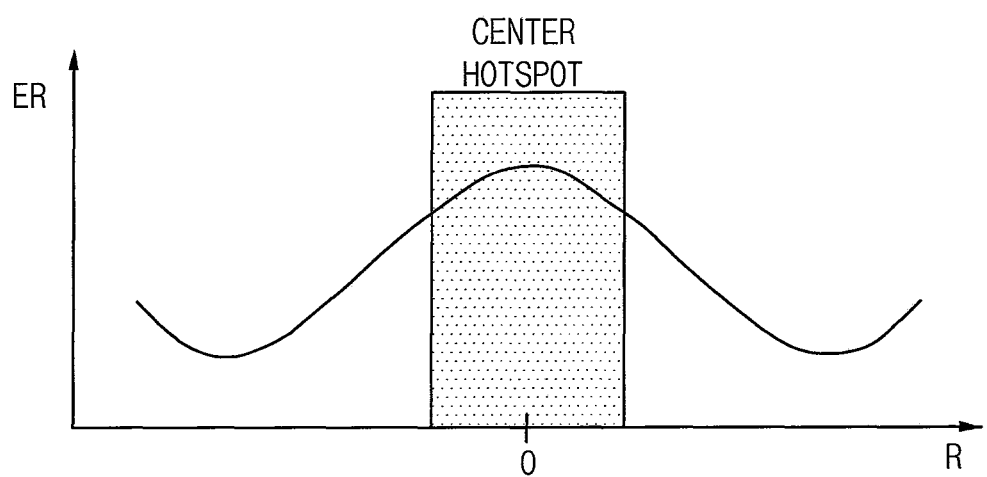
FIG. 16 is a graph showing an etch rate of a wafer in a plasma chamber.

FIG. 16 is a graph showing an etch rate of a wafer in a plasma chamber.

In FIG. 16, the horizontal axis indicates a radius R of the wafer and the vertical axis indicates an etch rate ER.

Referring to FIG. 16, in general plasma processing, the etch rate ER may be high at the central portion of the wafer and decrease toward the edge of the wafer. Such a phenomenon in which an etch rate increases toward the central portion of a wafer is called a center hotspot, which is shaded in the graph.

The center hotspot may worsen as RF power increases. In addition, punching, not open (NOP), a crater, and/or clogging may occur due to the center hotspot. Here, punching or NOP may refer to a problem in that a membrane has an unintended hole or a hole is not open during plasma etching (respectively), and a crater or clogging may refer to a problem in that a surface rises up or a hole is turned-on (respectively) due to process gas control for improvement of a center hotspot.

Specific causes of the center hotspot may not be clear. However, harmonic components of a VHF may increase plasma density at the center of the wafer (which may correspond to the substrate 70). Accordingly, without being bound by theory, it is believed that increased plasma density may cause an etch rate to increase at the center of the wafer.

In the case of a general plasma processing system, a center hot spot may be mitigated by controlling the amount of process gas according to positions in a plasma chamber and/or changing the shape of a top electrode. However, the methods for controlling the amount of process gas may cause control difficulties, and may cause the crater and/or clogging problem described above. Also, an approach of changing the shape of the top electrode may involve the inconvenience of changing the shape every time the process conditions are changed. In addition, a change may occur over time with respect to etching of a top electrode, which cannot be compensated for, nor predicted.

Figure 17:
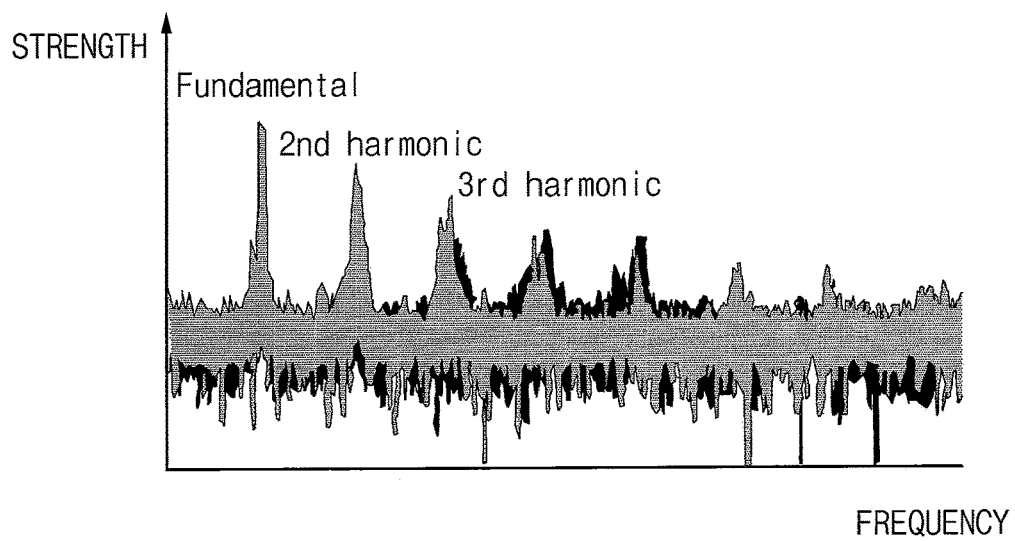
FIG. 17 is a graph showing fundamental and harmonic components of a VHF among the frequencies of RF power in a transmission line.

FIG. 17 is a graph showing fundamental and harmonic components of a VHF among the frequencies of RF power in a transmission line.

In FIG. 17, it is assumed that a transmission line is connected between the filter circuit 700 and the top electrode 228 in FIG. 14.

In FIG. 17, the horizontal axis indicates a frequency of the VHF and the vertical axis indicates a strength of the VHF.

Referring to FIG. 17, generally, when RF power is applied to the plasma chamber 200, harmonic components of the frequencies of the RF power are blocked by the LPF 710, and therefore, only a fundamental wave may be transmitted to the plasma chamber 200 through the transmission line.

However, some harmonics may not be completely blocked by the LPF 710 and may be transmitted to the plasma chamber 200, or harmonics at the VHF may be generated due to the non-linear characteristics of VHF RF power and plasma, as described above. Such harmonics may cause non-uniform plasma distribution in the plasma chamber 200.

The graph of FIG. 17 shows VHF harmonics detected in the transmission line, e.g., implemented as an RF load. In the graph, peaks may correspond to a fundamental, a second harmonic, and a third harmonic, respectively, at the VHF. The fundamental may correspond to a first harmonic.

Figure 18:
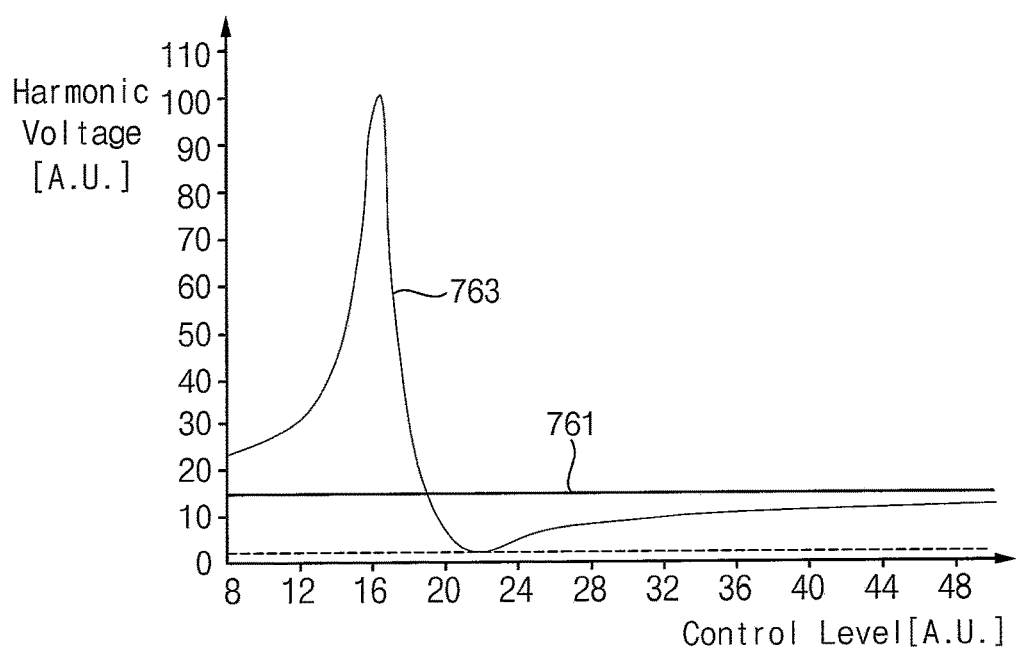
FIG. 18 is a graph showing a change in a harmonic voltage and a change in an etch rate with respect to impedance control of a plasma control device.

FIG. 18 is a graph showing a change in a harmonic voltage and a change in an etch rate with respect to impedance control of a plasma control device.

In FIG. 18, the horizontal axis indicates an impedance control level of the plasma control device and the vertical axis indicates a harmonic voltage or power. Here, [A.U.] may be a unit referring to a relative size.

Referring to FIG. 18, when there is no impedance control by the plasma control device PCDb as a reference numeral 761 indicates, a harmonic may be more or less maintained at a certain voltage and/or power.

When impedance control is performed by the plasma control device PCDb as a reference numeral 763 indicates, a harmonic voltage may be significantly changed. In addition, the harmonic voltage may be decreased by impedance control and maintained to be lower than that when there is no impedance control.

The impedance control by the plasma control device PCDb may refer to producing resonance for a harmonic and adjusting ground impedance using the plasma control device PCDb. For example, impedance for a harmonic may be minimized and/or changed by producing the resonance for the harmonic using the plasma control device PCDb and the plasma distribution may be adjusted by controlling a maximum impedance of the ground impedance.

Figure 19:
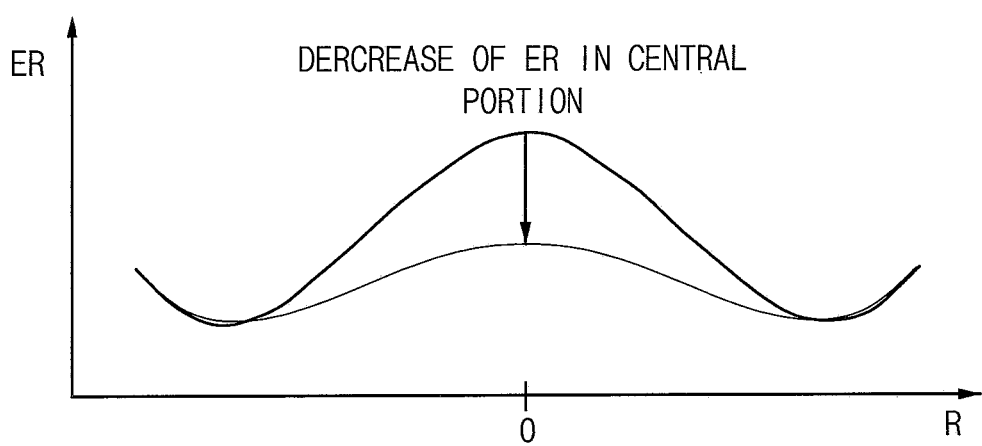
FIG. 19 is a graph showing a change in an etch rate in a central portion of a plasma chamber in the plasma processing system of FIG. 14.

FIG. 19 is a graph showing a change in an etch rate in a central portion of a plasma chamber in the plasma processing system of FIG. 14.

In FIG. 19, the horizontal axis indicates the radius R of a wafer and the vertical axis indicates the etch rate ER.

Referring to FIG. 19, the bold line represents the etch rate ER when there is no impedance control by the plasma control device PCDb, and is substantially the same as the graph of FIG. 16.

The thin line represents the etch rate ER when there is impedance control by the plasma control device PCDb.

As seen from the graph, the etch rate ER at the central portion of the wafer may be significantly decreased through the impedance control by the plasma control device PCDb.

Accordingly, the plasma processing system 50c may effectively alleviate or eliminate a center hotspot, which occurs when there is no impedance control, by performing impedance control using the plasma control device PCDb.

FIG. 20 is a flowchart illustrating a method of performing plasma processing according to example embodiments.

Referring to FIGS. 1, 2A and 20, in a method of performing plasma processing according to example embodiments, the substrate 70 is loaded onto the bottom electrode 236 within the plasma chamber 200 (operation S810). A process gas is supplied within the plasma chamber 200 (operation S820).

For example, the substrate 70 such as the semiconductor wafer may be loaded on the electrostatic chuck of a substrate stage within the plasma chamber 200. The process gas (for example, an etching process gas) may be introduced into the plasma chamber 200 from the source tube 224, and then a pressure of the plasma chamber 200 may be controlled to a desired/predetermined vacuum level by the exhaust port 215.

After that, the RF driving signal RFDS is applied to the top electrode 228 to form the plasma within the plasma chamber 200 (operation S830). Plasma distribution within the plasma chamber 200 is controlled by providing resonance with respect to harmonics by the resonance circuit 400 and by adjusting a ground impedance (operation S840). An etching process is performed on the layer on the substrate 70 (operation S850).

Operation S840 may be performed by the resonance circuit 400 described with reference to FIGS. 1 through 19.

For example, when the RF driving signal RFDS having the first frequency (for example, about 13.56 MHz) is applied to the top electrode 228, an electromagnetic field induced by the top electrode 228 may be applied to a source gas within the plasma chamber 200 to generate the plasma.

For example, when the resonance circuit 400 controls plasma distribution within the plasma chamber 200 by providing resonance with respect to harmonics and by adjusting a ground impedance between the second electrode and 236 the ground voltage VSS to adjust intensity distribution of the electric field, the uniformity of the plasma distribution may be increased. For example, the layer on the substrate 70 may include a metal layer, a metal nitride layer, an insulation layer, a semiconductor layer, etc. Alternatively, the layer on the substrate 70 may be omitted, and the substrate 70 may be a layer to be etched.

FIG. 21 is a flowchart illustrating a method of manufacturing a semiconductor device according to example embodiments.

Referring to FIGS. 1, 2A, and 21, in a method of manufacturing a semiconductor device according to example embodiments, the plasma processing is performed on the substrate 70 (operation S910). The semiconductor device is fabricated using the substrate 70 on which the plasma processing is performed (operation S930).

The operation S910 may be performed based on the method of performing the plasma processing according to example embodiments described with reference to FIG. 20.

By way of summation and review, radio frequency (RF) power of various frequencies may be used to independently control ion energy and plasma density. The RF power may be applied as pulses to improve an etching rate and an etching profile. When the RF source power of a high frequency is applied to increase the etching rate, a center-high power distribution may be caused due to a harmonic wave that is generated due to nonlinearity of the RF source power and the plasma. Thus, uniformity of plasma may be improved by removing the harmonic wave. However, general circuitry for removing the harmonic wave may result in loss of power with respect to a fundamental frequency of the RF source power and the etching rate.

As described above, embodiments may provide a plasma control device and a plasma processing system capable of efficiently improving plasma characteristics. The plasma control device and the plasma processing system may apply a RF driving signal to a first electrode of a plasma chamber, and may increase uniformity of plasma distribution by providing resonance to harmonics using a resonance circuit connected between a second electrode and a ground voltage, and by adjusting ground impedance between the second electrode and the ground voltage by the resonance circuit. In addition, the plasma control device and the plasma processing system may easily cope with a change of characteristic of the plasma chamber.

Example embodiments may be embodied as a system, method, computer program product, and/or a computer program product embodied in one or more computer readable medium(s) having computer readable program code embodied therein. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Example embodiments may be applied to various semiconductor devices and manufacturing processes of the semiconductor devices. For example, the example embodiments may be applied to the manufacturing processes of the semiconductor devices such as a memory device, a processing device, etc. For example, the example embodiments may be applied to the manufacturing processes of systems including the memory device and the processing device such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A plasma control device, comprising:
a matching circuit connected to a first electrode of a plasma chamber including the first electrode and a second electrode, the matching circuit configured to match impedance of a radio frequency (RF) power by an RF driving signal with an impedance of the first electrode, the RF driving signal being based on a first RF signal having a first frequency;

a resonance circuit connected between the second electrode and a ground voltage, the resonance circuit configured to control plasma distribution within the plasma chamber by providing resonance with respect to harmonics associated with the first frequency and by adjusting a ground impedance between the second electrode and the ground voltage; and a controller configured to provide the resonance circuit with a capacitance control signal associated with the resonance and switch control signals associated with the ground impedance, wherein the resonance circuit includes
a switching resistor circuit connected between a first node coupled to the second electrode and a ground node coupled to the ground voltage, the switching resistor circuit configured to adjust the ground impedance by providing different resistance values in response to the switch control signals, and a variable capacitor connected between the first node and the ground node in parallel with the switching resistor circuit.

2. The plasma control device as claimed in claim 1, wherein the resonance circuit further includes:
an inductor connected between the first node and the ground node in parallel with the variable capacitor, the inductor having a fixed inductance.

3. The plasma control device as claimed in claim 2, wherein the switching resistor circuit includes:
a plurality of resistors connected to the first node in parallel with respect to each other; and
a plurality of switches connected to the ground node in parallel with respect to each other, each of the plurality of switches being connected to a corresponding one of the plurality of resistors, and
wherein each of the plurality of switches is selectively turned on in response to a corresponding one of the switch control signals.

4. The plasma control device as claimed in claim 3, wherein respective ones of the plurality of resistors have different resistance values.

5. The plasma control device as claimed in claim 3, wherein the controller is configured to increase uniformity of the plasma distribution within the plasma chamber by increasing a resistance value provided by the switching resistor circuit.

6. The plasma control device as claimed in claim 3, the controller is configured to increase a full width half maximum (FWHM) of a resonance frequency when the resonance occurs, by decreasing a resistance value provided by the switching resistor circuit.

7. The plasma control device as claimed in claim 2, wherein the variable capacitor includes a vacuum variable capacitor having an upper electrode and a lower electrode, and
wherein the vacuum variable capacitor is configured to adjust a capacitance by adjusting a gap between the upper electrode and the lower electrode, in response to the capacitance control signal.

8. The plasma control device as claimed in claim 2, wherein the variable capacitor is configured to provide a capacitance ranging from 50 pF to 1000 pF.

9. The plasma control device as claimed in claim 2, wherein the inductor is configured to provide an inductance of 0.5 µH to 10 µH.

10. The plasma control device as claimed in claim 1, wherein the first electrode corresponds to one of a top electrode or a bottom electrode of the plasma chamber, and the second electrode corresponds to the other of the top electrode or the bottom electrode of the plasma chamber;
wherein the RF driving signal at least includes a first RF driving signal having the first frequency, and a second RF driving signal having a second frequency lower than the first frequency, and
wherein the matching circuit includes:
a first sub matching circuit configured to match an RF power by the first RF driving signal with an impedance of the top electrode; and
a second sub matching circuit configured to match an RF power by the second RF driving signal with the impedance of the top electrode.

11. The plasma control device as claimed in claim 10, further comprising:
a filter circuit configured to block harmonic components from the matching circuit.

12. The plasma control device as claimed in claim 11, wherein the filter circuit includes a low pass filter configured to pass a fundamental wave of the first frequency and the second frequency, and configured to block the harmonic components.

13. A plasma processing system, comprising:
a plasma chamber including a first electrode and a second electrode;
a radio frequency (RF) power generator configured to generate a first RF driving signal based on a first RF signal having a first frequency and a second RF driving signal based on a second RF signal having a second frequency smaller than the first frequency, and configured to apply the first RF driving signal and the second RF driving signal to the first electrode;
a matching circuit configured to match impedance of an RF power by the first RF driving signal with an impedance of the first electrode, and configured to match impedance of an RF power by the second RF driving signal with the impedance of the first electrode;
a resonance circuit connected between the second electrode and a ground voltage, the resonance circuit configured to control plasma distribution within the plasma chamber by providing resonance with respect to harmonics associated with the first frequency and the second frequency, and by adjusting a ground impedance between the second electrode and the ground voltage; and
a controller configured to provide the resonance circuit with a capacitance control signal associated with the resonance and switch control signals associated with the ground impedance,
wherein the resonance circuit includes
a switching resistor circuit connected between a first node coupled to the second electrode and a ground node coupled to the ground voltage, the switching resistor circuit configured to adjust the ground impedance by providing different resistance values in response to the switch control signals, and
a variable capacitor connected between the first node and the ground node in parallel with the switching resistor circuit.

14. The plasma processing system as claimed in claim 13, wherein the resonance circuit further includes:
an inductor connected between the first node and the ground node in parallel with the variable capacitor, the inductor having a fixed inductance.

15. The plasma processing system as claimed in claim 14, wherein the switching resistor circuit includes:
a plurality of resistors connected to the first node in parallel with respect to each other; and
a plurality of switches connected to the ground node in parallel with respect to each other, each of the plurality of switches being connected to a corresponding one of the plurality of resistors,
wherein each of the plurality of switches is selectively turned on in response to a corresponding one of the switch control signals, and
wherein respective ones of the plurality of resistors have different resistance values.

16. The plasma processing system as claimed in claim 14, wherein the variable capacitor includes a vacuum variable capacitor having an upper electrode and a lower electrode,
wherein the vacuum variable capacitor is configured to adjust a capacitance by adjusting a gap between the upper electrode and the lower electrode, in response to the capacitance control signal,
wherein the vacuum variable capacitor is configured to provide a capacitance ranging from 50 pF to 1000 pF, and
wherein the inductor is configured to provide an inductance of 0.5 µH to 10 µH.

17. The plasma processing system as claimed in claim 13, further comprising:
a harmonic control circuit connected between the matching circuit and the first electrode, the harmonic control circuit configured to be driven based on a harmonic control signal to reduce a harmonic component of the first RF driving signal and the second RF driving signal, and
wherein the controller is configured to generate the harmonic control signal including harmonic control pulses.

18. The plasma processing system as claimed in claim 17, wherein the controller is configured to control timings of the harmonic control pulses based on overlapping periods of first pulses of the first RF driving signal and second pulses of the second RF driving signal.

19. The plasma processing system as claimed in claim 17, wherein the harmonics control circuit includes:
a plurality of impedance circuits configured to be electrically connected, in response to a plurality of switch signals, to a path through which the first RF driving signal or the second RF driving signal is transferred; and
a switch controller configured to generate the plurality of switch signals based on the harmonic control signal and a total impedance that is set to reduce the harmonic component.

20. A plasma control device, comprising:
a matching circuit connected to a first electrode of a plasma chamber including the first electrode and a second electrode, the matching circuit configured to match impedance of a radio frequency (RF) power by an RF driving signal with an impedance of the first electrode, the RF driving signal being based on a first RF signal having a first frequency;
a resonance circuit connected between the second electrode and a ground voltage, the resonance circuit configured to control plasma distribution within the plasma chamber by providing resonance with respect to harmonics associated with the first frequency and by adjusting a ground impedance between the second electrode and the ground voltage; and
a controller configured to provide the resonance circuit with a capacitance control signal associated with the resonance and switch control signals associated with the ground impedance,
wherein the resonance circuit includes:
a switching resistor circuit connected between a first node and a ground node, the switching resistor circuit configured to adjust the ground impedance by providing different resistance value in response to the switch control signals, and
wherein the switching resistor circuit includes:
a plurality of resistors connected in parallel with respect to each other to the first node; and
a plurality of switches connected in parallel with respect to each other to the ground node, each of the plurality of switches being connected to a corresponding one of the plurality of resistors, and
wherein each of the plurality of switches is selectively turned on in response to a corresponding one of the switch control signals.

* * * * *